(12) United States Patent
Loubet et al.

(10) Patent No.: US 10,903,315 B2
(45) Date of Patent: Jan. 26, 2021

(54) FORMATION OF DIELECTRIC LAYER AS ETCH-STOP FOR SOURCE AND DRAIN EPITAXY DISCONNECTION

(71) Applicant: INTERNATIONAL BUSINESS MACHINES CORPORATION, Armonk, NY (US)

(72) Inventors: Nicolas Loubet, Guilderland, NY (US); Robin Hsin Kuo Chao, Cohoes, NY (US); Julien Frougier, Albany, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 68 days.

(21) Appl. No.: 16/146,342

(22) Filed: Sep. 28, 2018

(65) Prior Publication Data

US 2020/0105868 A1 Apr. 2, 2020

(51) Int. Cl.
| | |
|---|---|
| *H01L 29/06* | (2006.01) |
| *H01L 29/51* | (2006.01) |
| *H01L 29/66* | (2006.01) |
| *H01L 21/768* | (2006.01) |
| *H01L 21/308* | (2006.01) |
| *H01L 29/08* | (2006.01) |
| *H01L 29/78* | (2006.01) |

(52) U.S. Cl.
CPC ...... *H01L 29/0649* (2013.01); *H01L 21/3086* (2013.01); *H01L 21/76829* (2013.01); *H01L 29/0673* (2013.01); *H01L 29/0847* (2013.01); *H01L 29/517* (2013.01); *H01L 29/6681* (2013.01); *H01L 29/66545* (2013.01); *H01L 29/7851* (2013.01)

(58) Field of Classification Search
None
See application file for complete search history.

(56) References Cited

U.S. PATENT DOCUMENTS

| | | |
|---|---|---|
| 8,298,875 B1 | 10/2012 | Or-Bach et al. |
| 8,956,942 B2 | 2/2015 | Loubet et al. |
| 9,620,590 B1 | 4/2017 | Bergendahl et al. |
| 9,761,722 B1 | 9/2017 | Jagannathan et al. |
| 10,164,041 B1 | 12/2018 | Xie et al. |
| 2013/0154016 A1 | 6/2013 | Glass et al. |
| 2013/0277752 A1 | 10/2013 | Glass et al. |
| 2015/0255556 A1 | 9/2015 | Cheng et al. |

(Continued)

OTHER PUBLICATIONS

List of IBM Patents or Patent Applications Treated as Related; Date Filed: Sep. 28, 2018, 2 pages.

(Continued)

*Primary Examiner* — Raj R Gupta
(74) *Attorney, Agent, or Firm* — Cantor Colburn LLP; Joseph Petrokaitis

(57) ABSTRACT

A technique relates to a semiconductor device. A bottom sacrificial layer is formed on a substrate. A stack is formed over the bottom sacrificial layer and a dummy gate is formed over the stack. The bottom sacrificial layer is removed from under the stack so as to leave an opening. An isolation layer is formed in the opening, the isolation layer being positioned between the stack and the substrate.

13 Claims, 38 Drawing Sheets

(56) References Cited

U.S. PATENT DOCUMENTS

2015/0333167 A1* 11/2015 Leobandung ..... H01L 21/02532
257/347
2017/0133459 A1 5/2017 Pranatharthiharan et al.
2018/0006111 A1* 1/2018 Xie ................. H01L 21/823481

OTHER PUBLICATIONS

N. Loubet et al., "Stacked Nanosheet Gate-All-Around Transistor to Enable Scaling Beyond FinFET," 2017 Symposium on VLSI Technology, pp. T230-T231.

Loubet et al., "Formation of Dielectric Layer as Etch-Stop for Source and Drain Epitaxy Disconnection," U.S. Appl. No. 16/146,377, filed Sep. 28, 2018.

Q. Zhang et al., "Novel GAA Si Nanowire p-MOSFETs with Excellent Short Channel Effect Immunity via an Advanced Forming Process," IEEE Electron Device Letters, 2018, 4 pages.

* cited by examiner

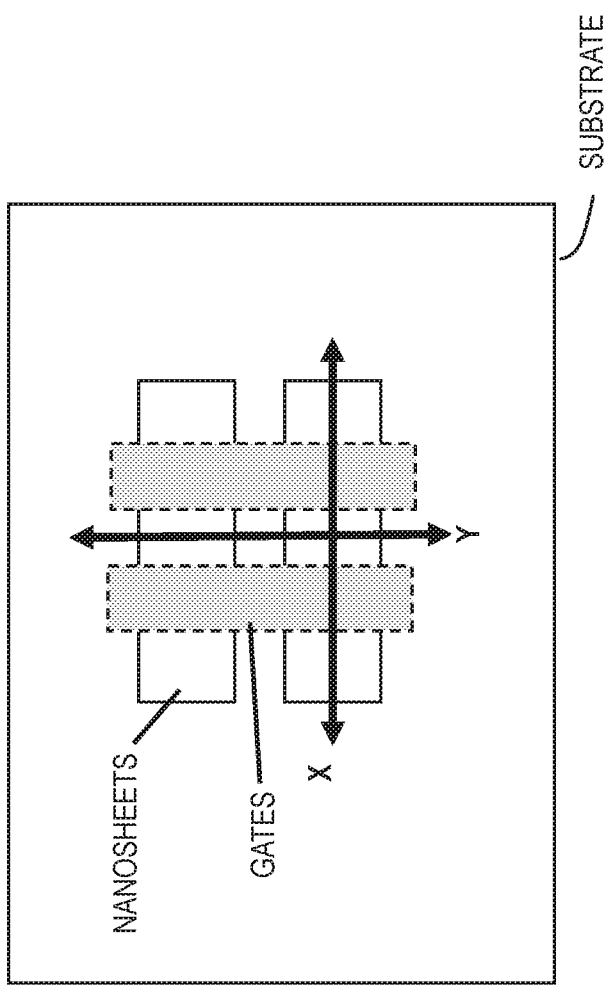

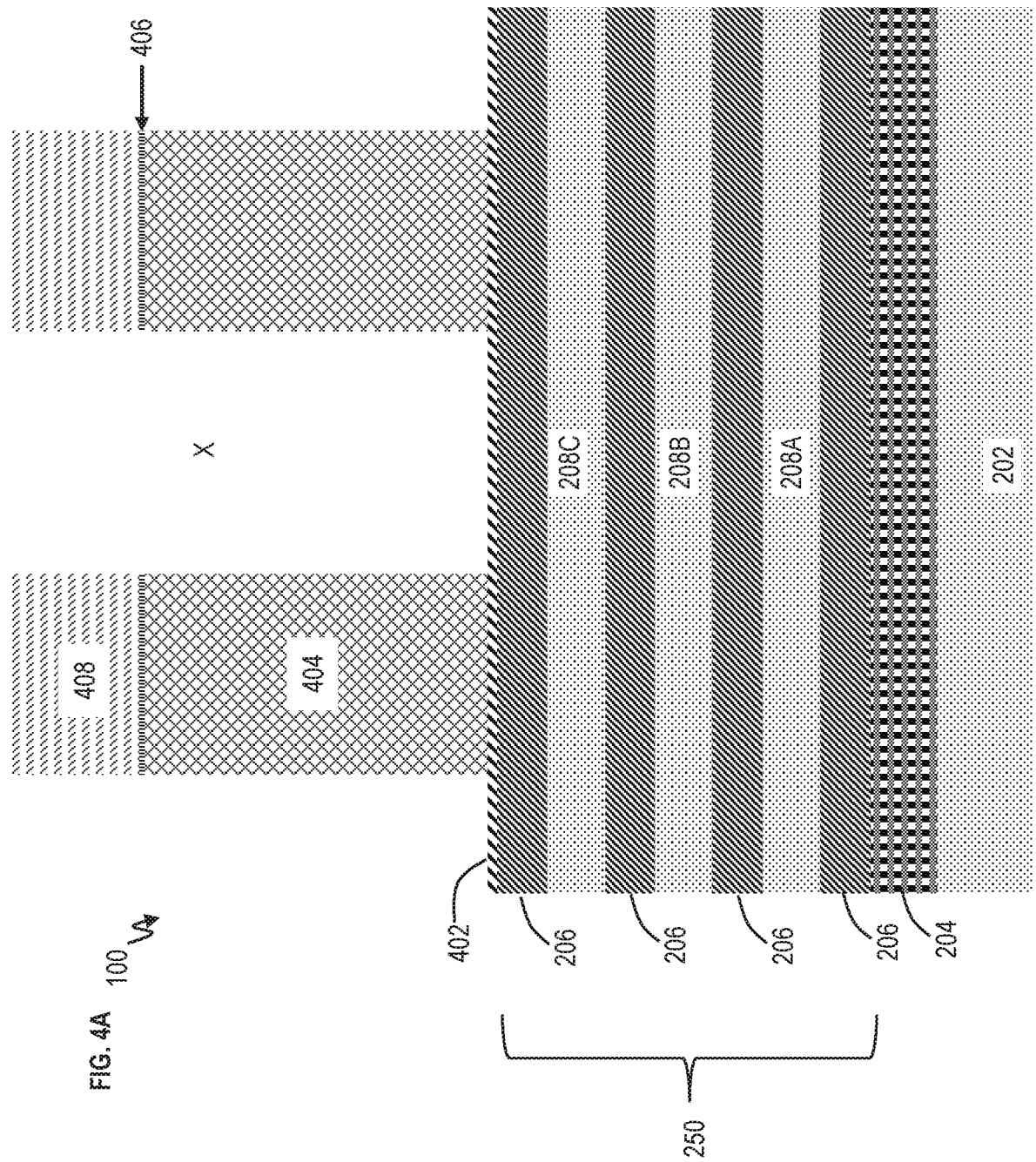

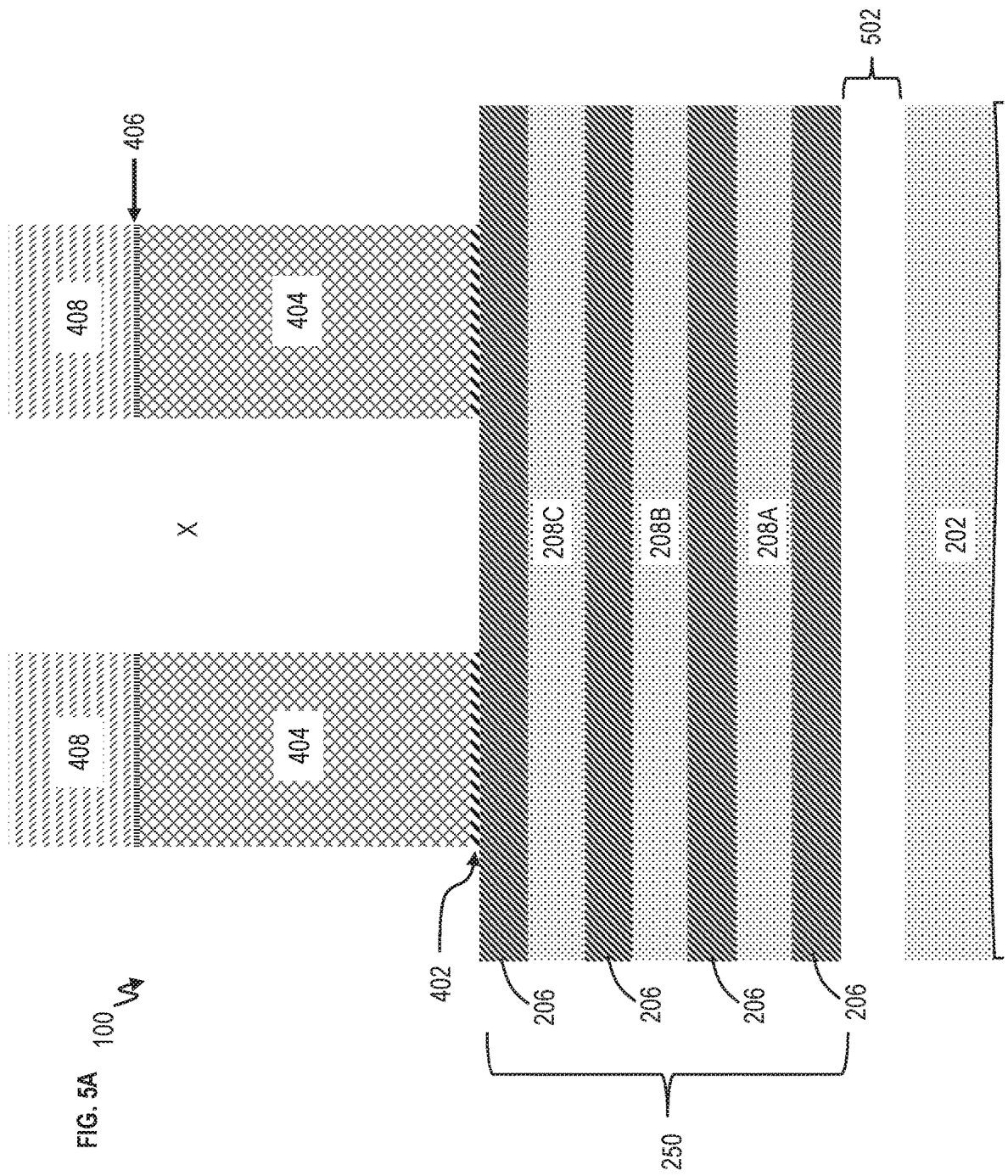

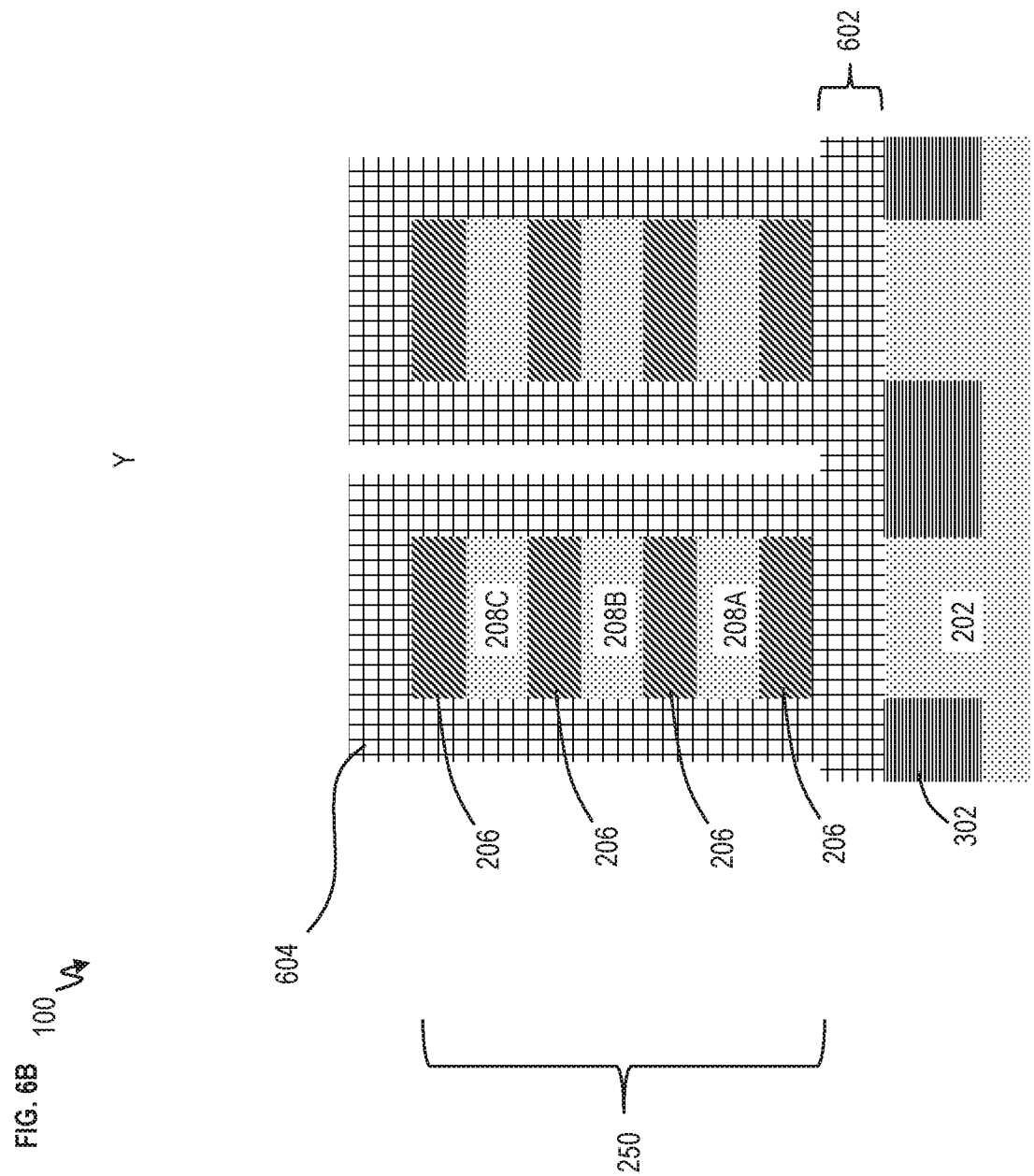

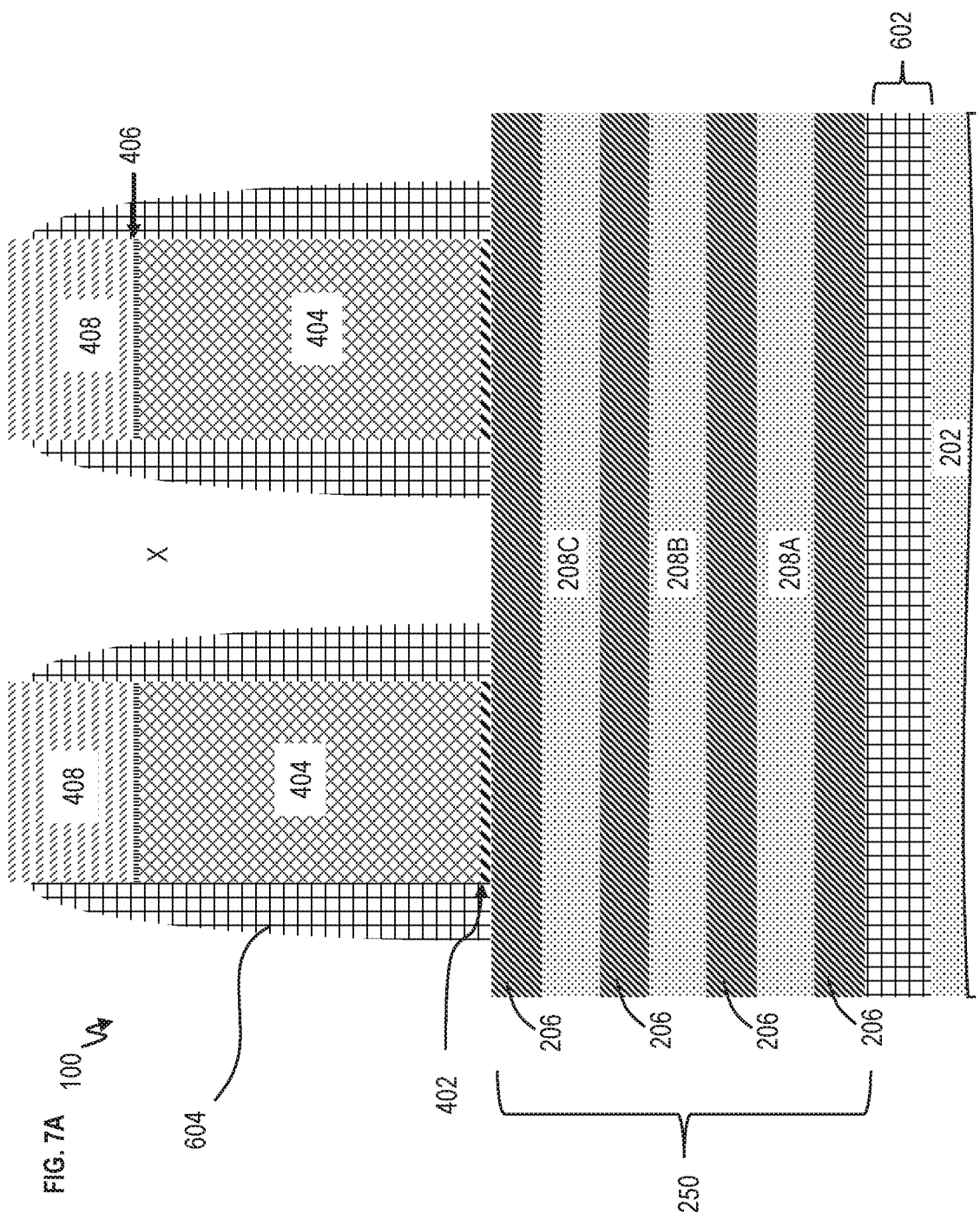

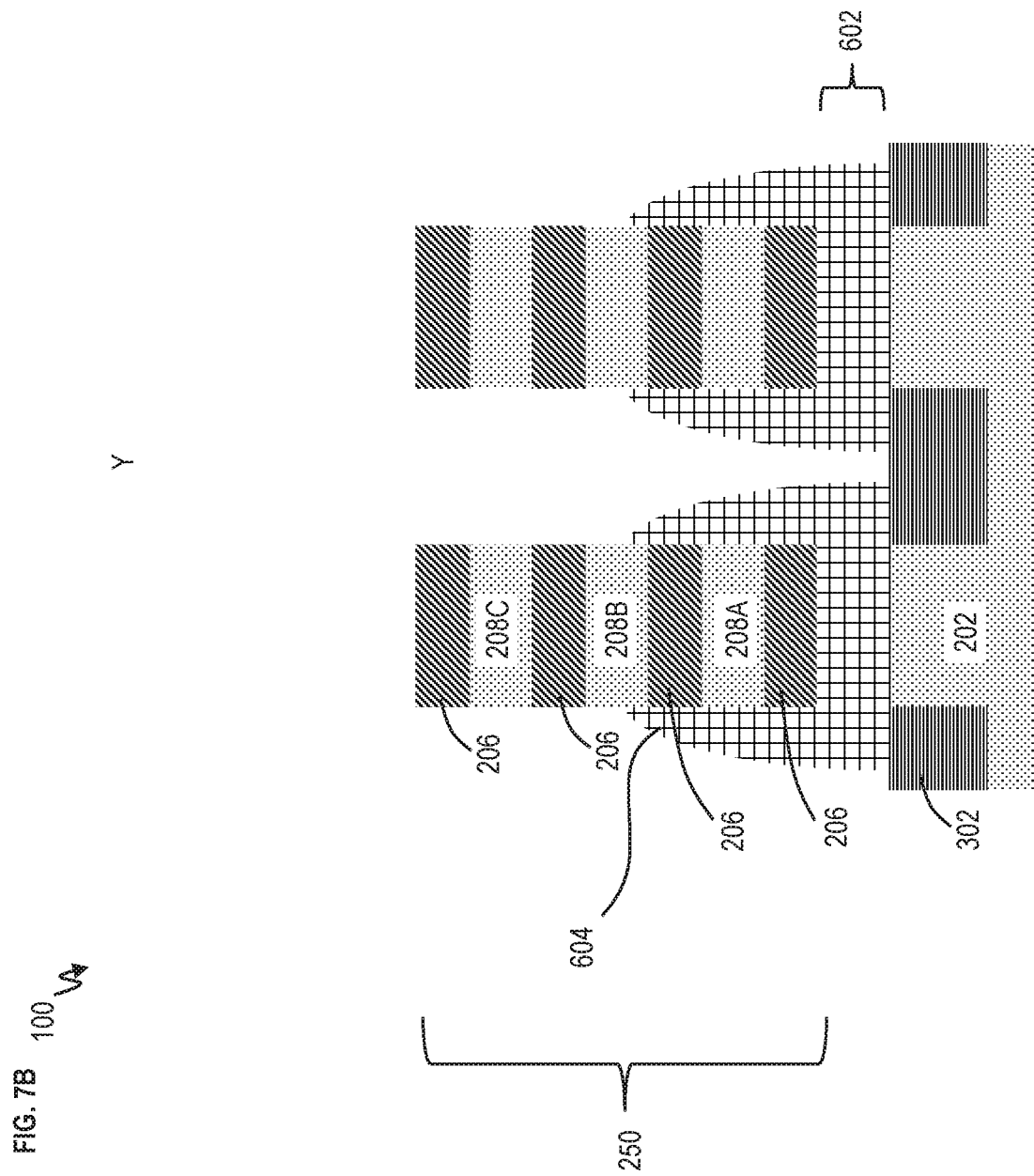

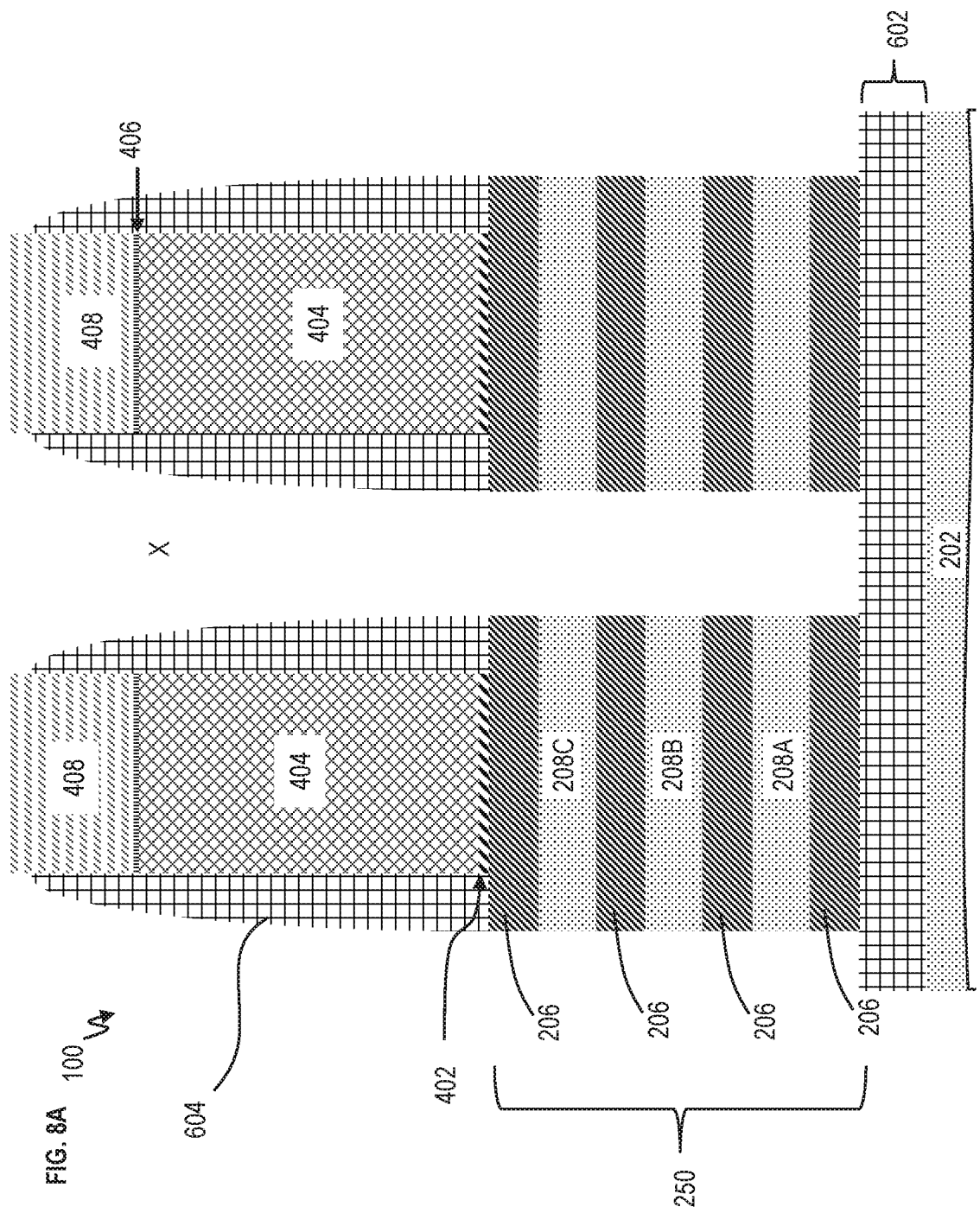

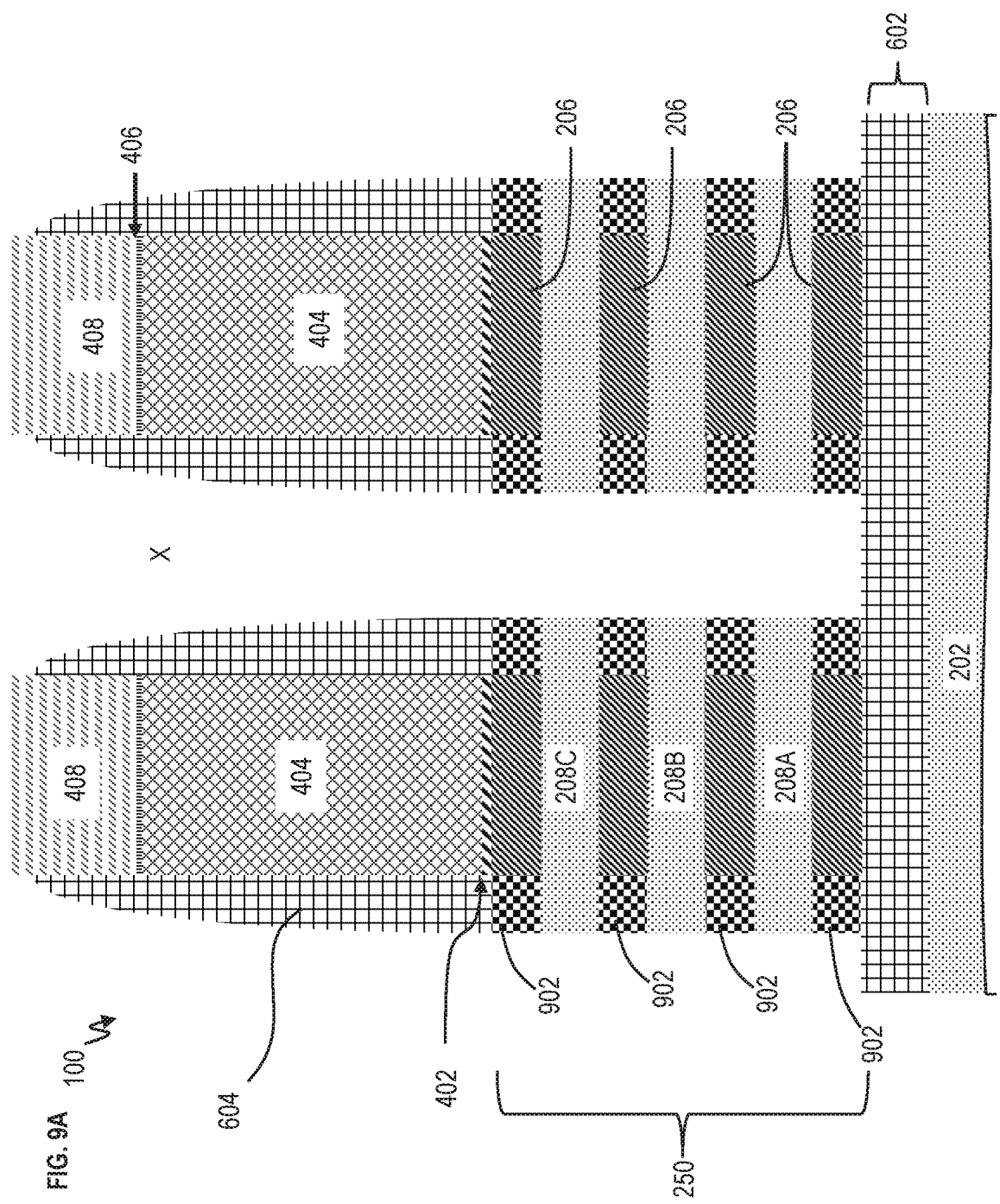

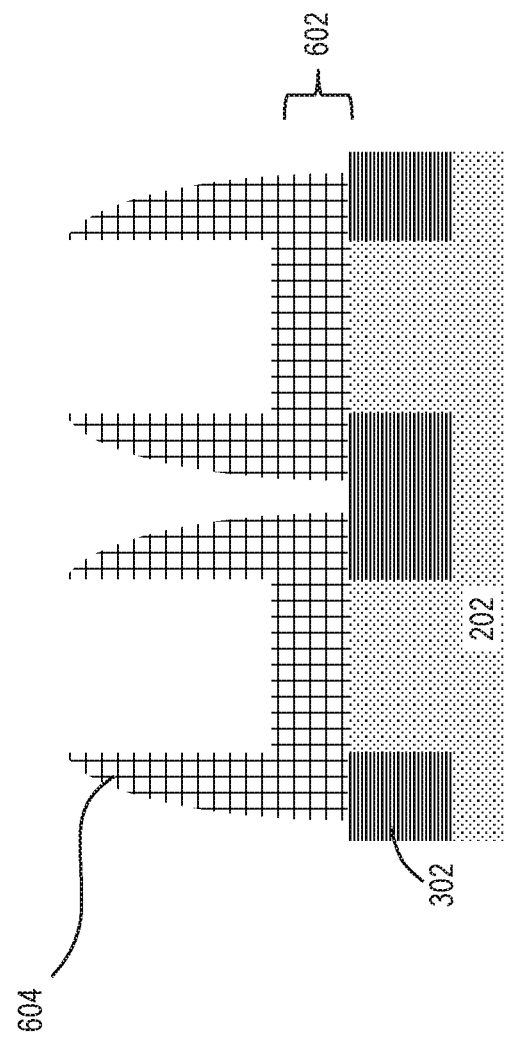

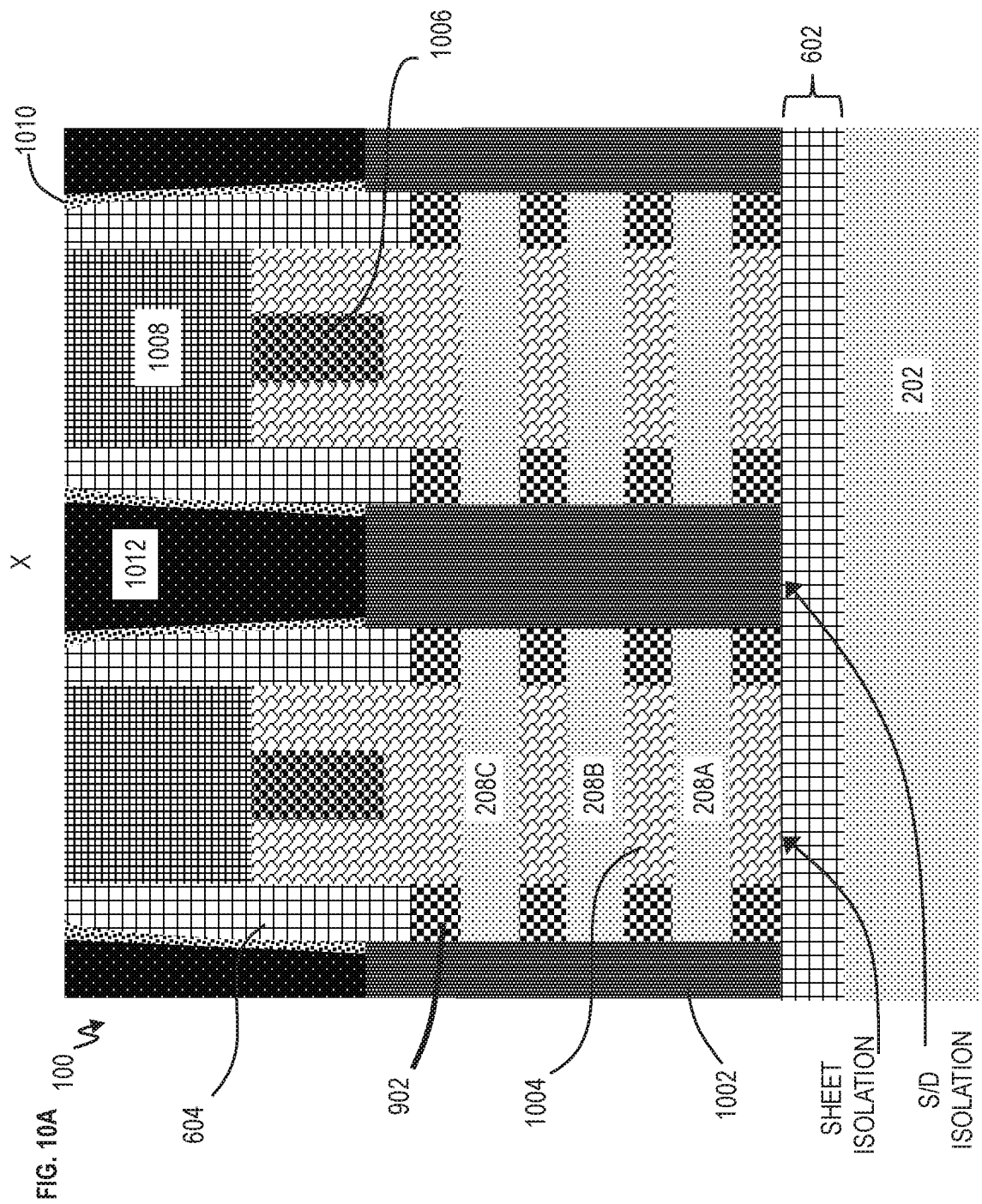

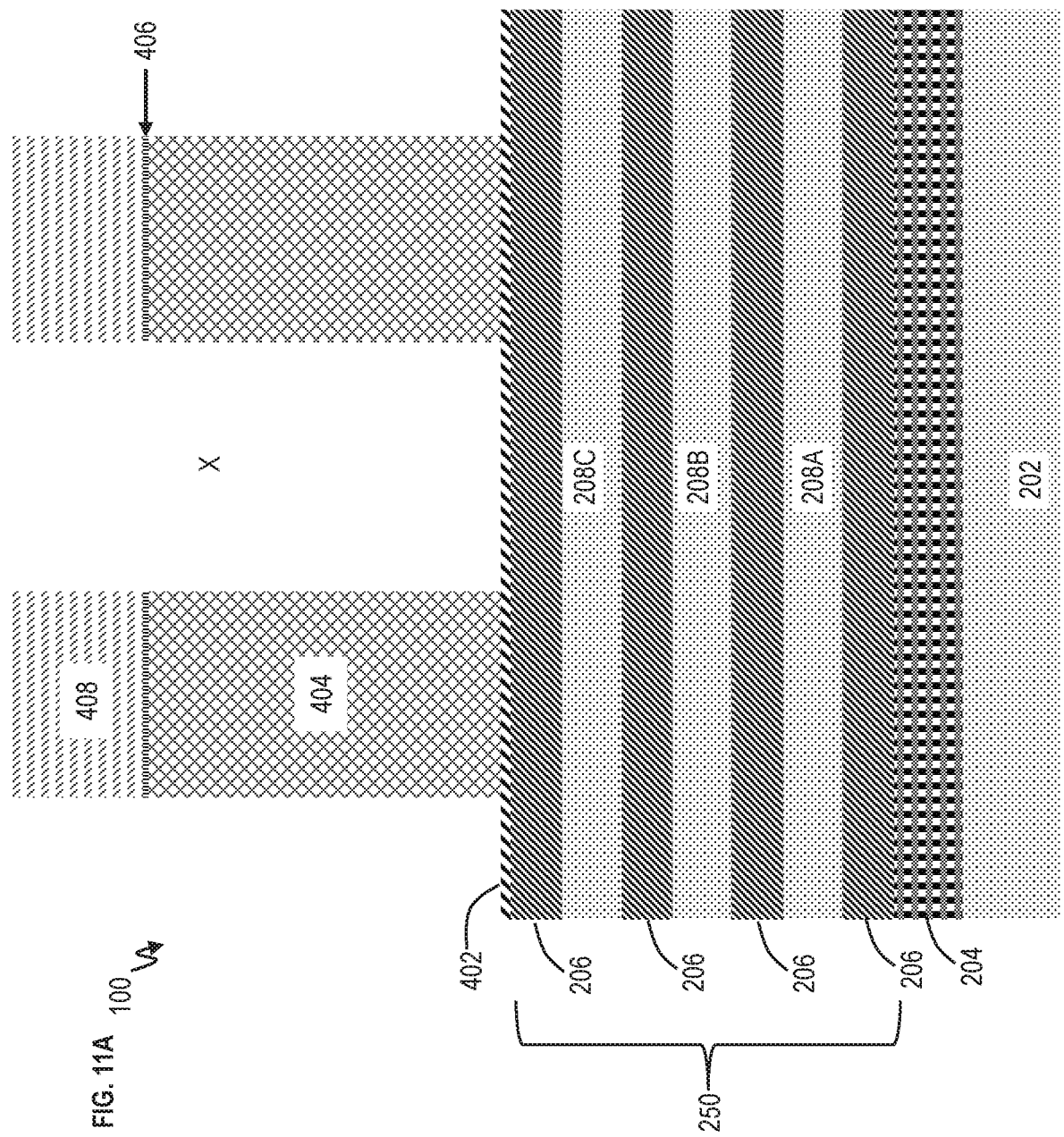

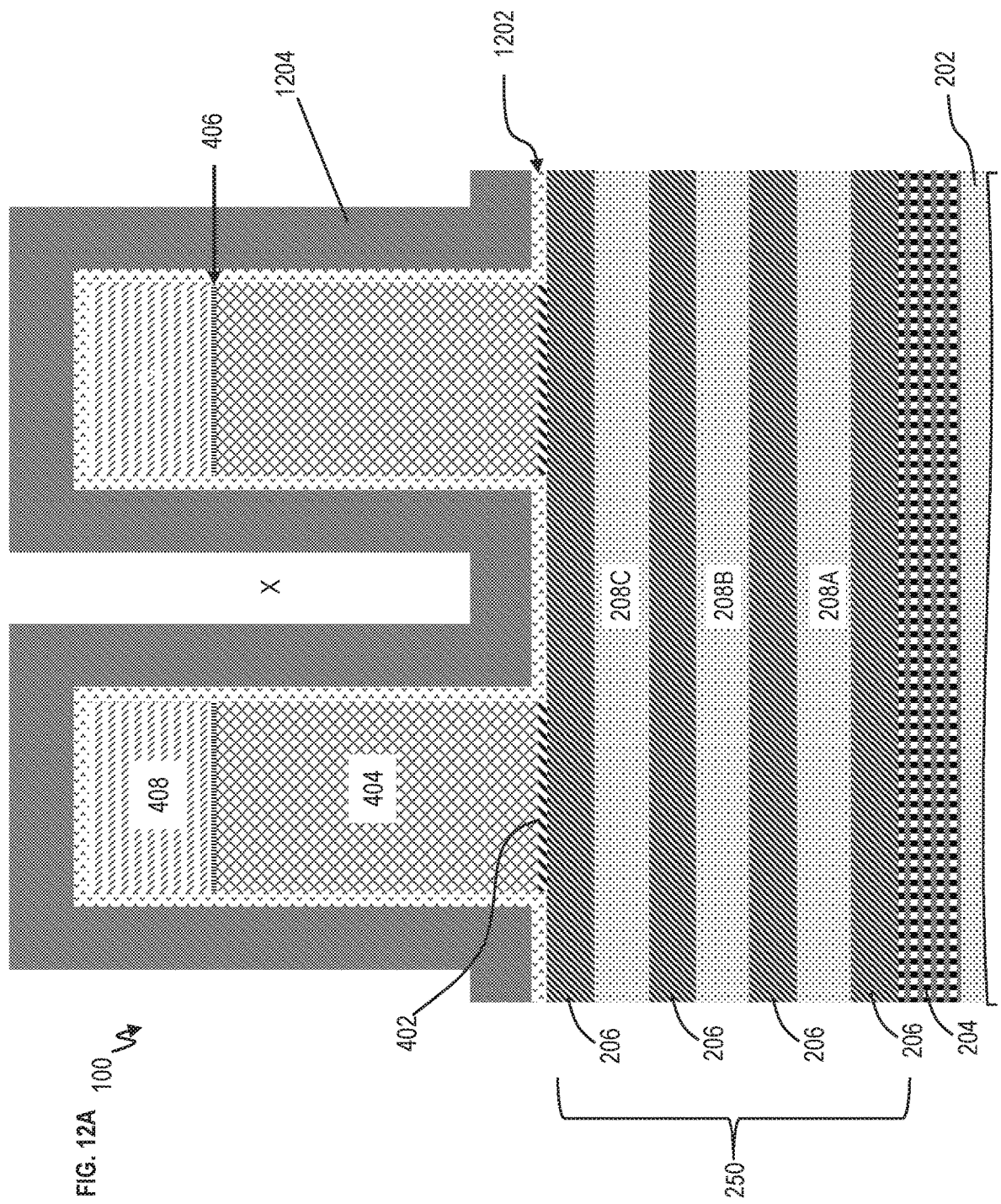

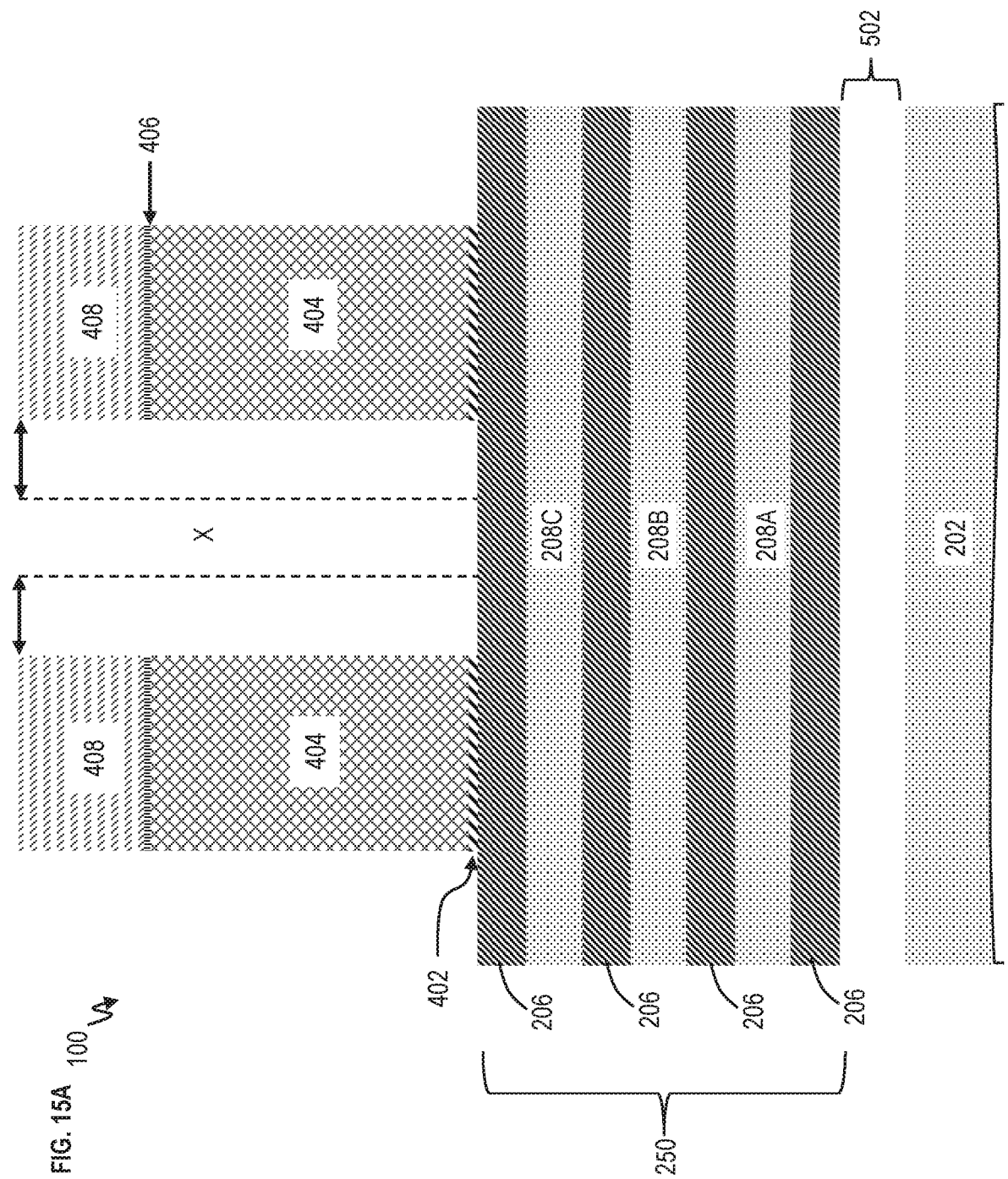

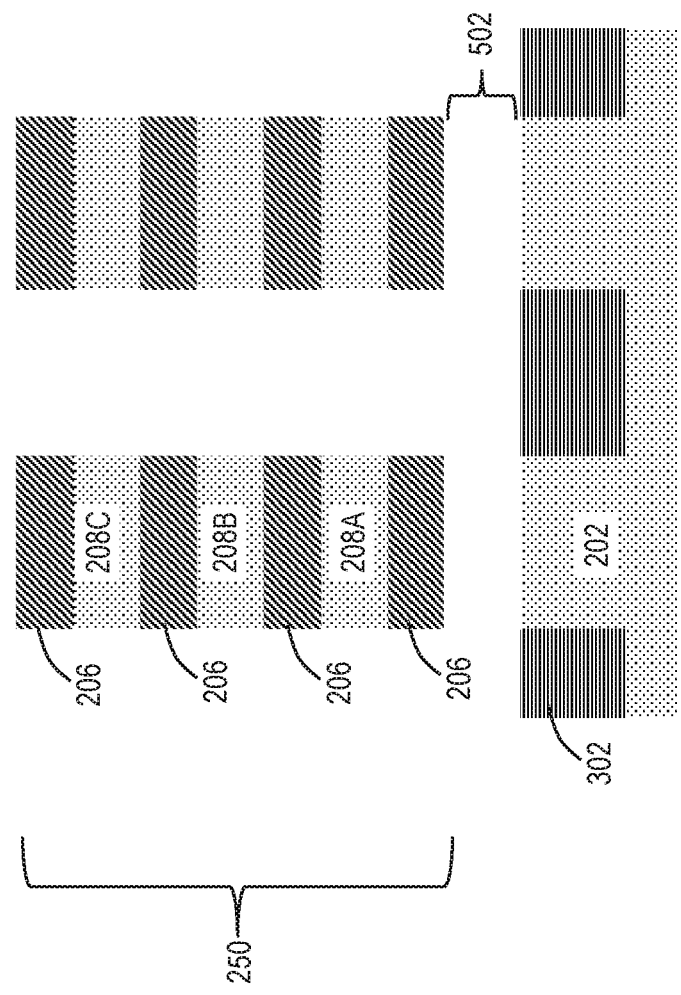

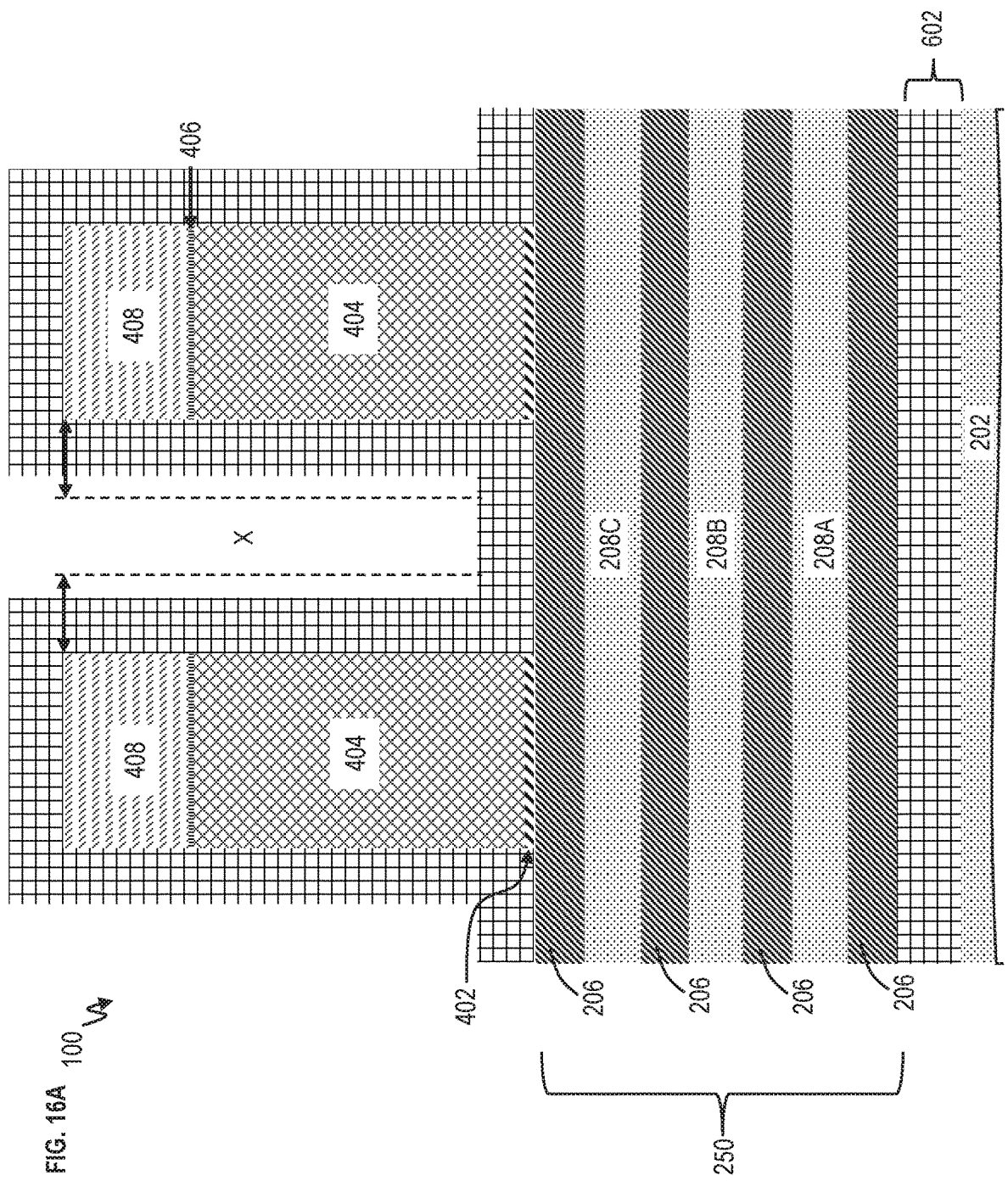

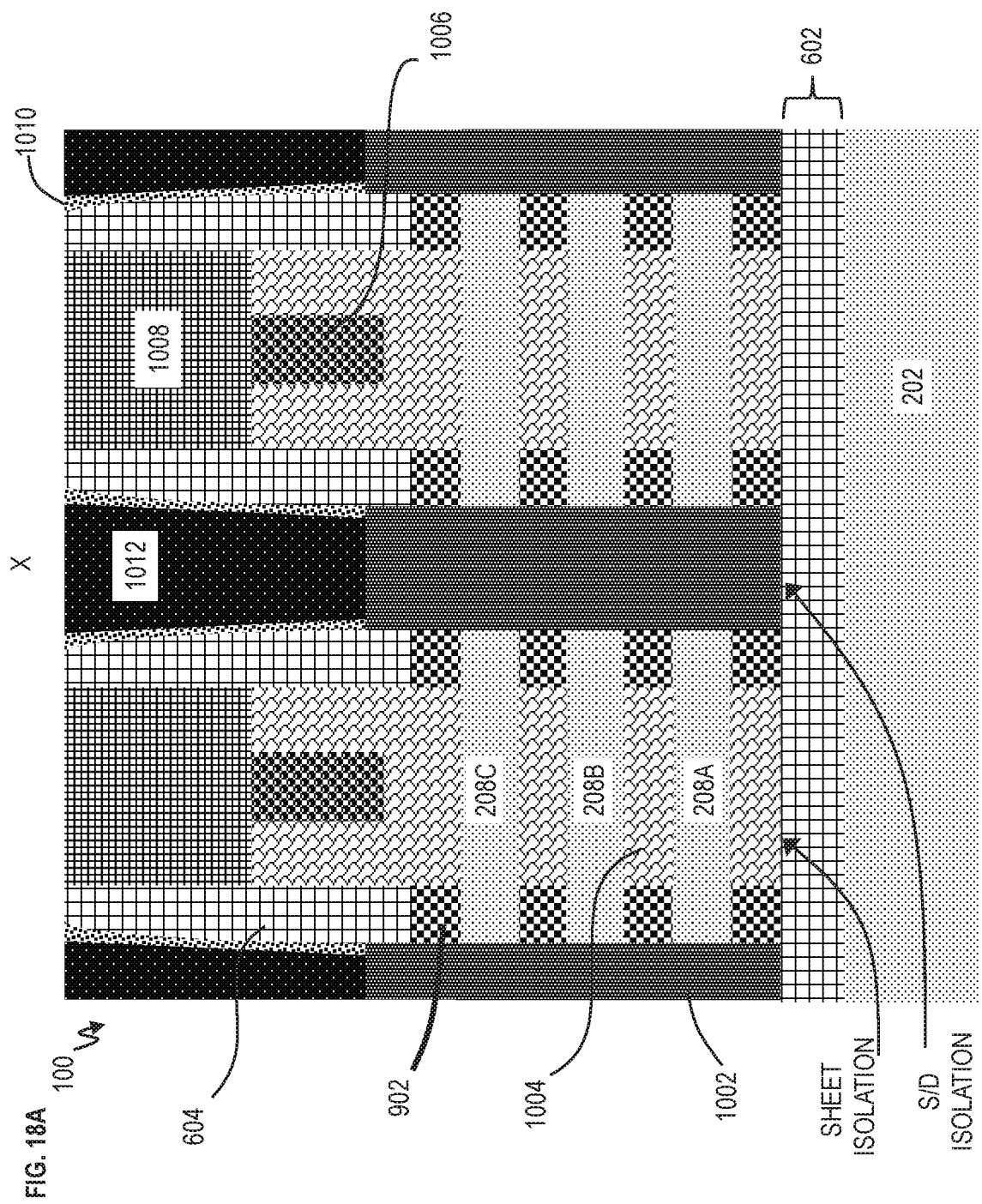

FORMATION OF DIELECTRIC LAYER AS ETCH-STOP FOR SOURCE AND DRAIN EPITAXY DISCONNECTION

BACKGROUND

The present invention generally relates to fabrication methods and resulting structures for semiconductor devices, and more specifically, to formation of a dielectric layer as etch-stop for source and drain epitaxy disconnection.

A metal-oxide-semiconductor field-effect transistors (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

SUMMARY

Embodiments of the invention are directed to a method for forming a semiconductor device. A non-limiting example of the method includes forming a bottom sacrificial layer on a substrate, and forming a stack over the bottom sacrificial layer and a dummy gate over the stack. The method includes removing the bottom sacrificial layer from under the stack so as to leave an opening and forming an isolation layer in the opening, the isolation layer being positioned between the stack and the substrate.

Embodiments of the invention are directed to a semiconductor device. A non-limiting example of the semiconductor device includes a substrate having one or more shallow trench isolation regions, and an isolation layer formed on the substrate and formed on portions of the one or more shallow trench isolation regions while not being formed on other portions of the one or more shallow trench isolation regions. Also, the semiconductor device includes channels formed over the isolation layer, source and drain regions formed on the isolation layer, and a conductive gate structure formed over the channels and the isolation layer.

Embodiments of the invention are directed to a method for forming a semiconductor device. A non-limiting example of the method includes forming a bottom sacrificial layer on a substrate, forming a stack over the bottom sacrificial layer, the stack comprising channel layers and sacrificial layers, and forming a dummy gate over the stack. The method includes removing the bottom sacrificial layer from under the stack so as to leave an opening, and forming an isolation layer in the opening, the isolation layer being positioned between the stack and the substrate. Also, the method includes forming source and drain regions on the isolation layer, and replacing the dummy gate and the sacrificial layers with a conductive gate structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a simple diagram of a top view of a semiconductor device according to embodiments of the invention;

FIG. 4A depicts a cross-sectional view of the semiconductor device taken along line X (shown in FIG. 1) after fabrication operations according to embodiments of the invention;

FIG. 5A depicts a cross-sectional view of the semiconductor device taken along line X (shown in FIG. 1) after fabrication operations according to embodiments of the invention;

FIG. 6B depicts a cross-sectional view of the semiconductor device taken along line Y (shown in FIG. 1) after fabrication operations according to embodiments of the invention;

FIG. 7A depicts a cross-sectional view of the semiconductor device taken along line X (shown in FIG. 1) after fabrication operations according to embodiments of the invention;

FIG. 7B depicts a cross-sectional view of the semiconductor device taken along line Y (shown in FIG. 1) after fabrication operations according to embodiments of the invention;

FIG. 8A depicts a cross-sectional view of the semiconductor device taken along line X (shown in FIG. 1) after fabrication operations according to embodiments of the invention;

FIG. 9A depicts a cross-sectional view of the semiconductor device taken along line X (shown in FIG. 1) after fabrication operations according to embodiments of the invention;

FIG. 9B depicts a cross-sectional view of the semiconductor device taken along line Y (shown in FIG. 1) after fabrication operations according to embodiments of the invention;

FIG. 10A depicts a cross-sectional view of the semiconductor device taken along line X (shown in FIG. 1) after fabrication operations according to embodiments of the invention;

FIG. 11A depicts a cross-sectional view of the semiconductor device taken along line X (shown in FIG. 1) after fabrication operations according to embodiments of the invention;

FIG. 12A depicts a cross-sectional view of the semiconductor device taken along line X (shown in FIG. 1) after fabrication operations according to embodiments of the invention;

FIG. 15A depicts a cross-sectional view of the semiconductor device taken along line X (shown in FIG. 1) after fabrication operations according to embodiments of the invention;

FIG. 15B depicts a cross-sectional view of the semiconductor device taken along line Y (shown in FIG. 1) after fabrication operations according to embodiments of the invention;

FIG. 16A depicts a cross-sectional view of the semiconductor device taken along line X (shown in FIG. 1) after fabrication operations according to embodiments of the invention;

FIG. 18A depicts a cross-sectional view of the semiconductor device taken along line X (shown in FIG. 1) after fabrication operations according to embodiments of the invention.

Figure 2A:
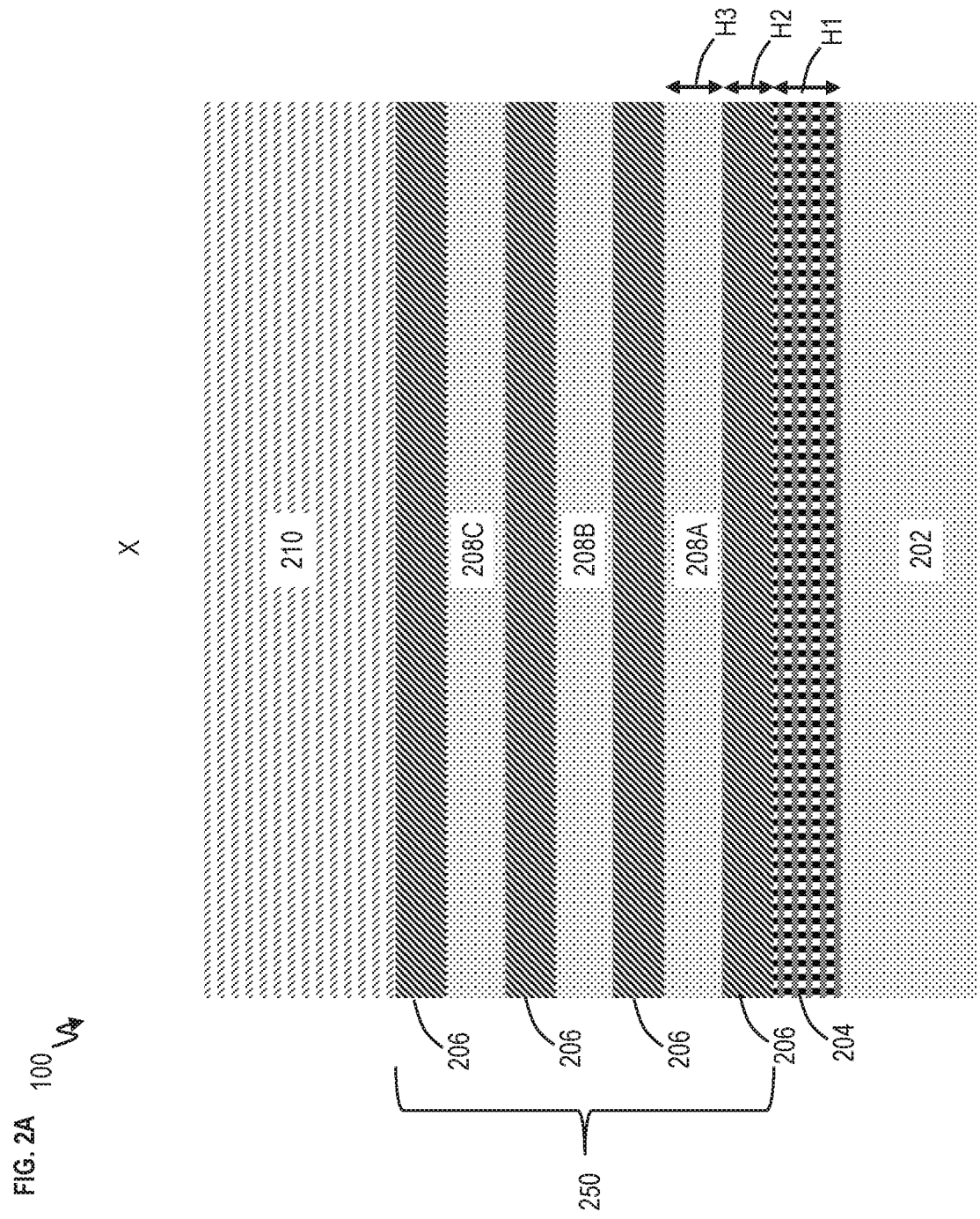
FIG. 2A depicts a cross-sectional view of the semiconductor device taken along line X in FIG. 1 after an initial set of fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, for nanosheet devices formed on a bulk substrate, the source and drain regions are epitaxially grown from (1) the side of the silicon nanosheets and (2) the bottom silicon substrate. This leads to parasitic source and drain leakage harming nanosheet FET performance. Particularly, the combination of the (1) epitaxy contacting the substrate in the source/drain region and (2) the high-k metal gate (HKMG) stack formed directly on the substrate in the sub-fin region form a bottom parasitic planar transistor degrading the performance of the gate-all-around nanosheet-FET. Accordingly, a better integration scheme is needed.

Turning now to an overview of the aspects of the invention, one or more embodiments of the invention provide semiconductor devices and methods of forming the semiconductor devices. Embodiments of the invention provide integration methods to form full bottom dielectric isolation of nanosheet FETs and/or FinFETs. Accordingly, the bottom dielectric isolation layer isolates the source and drain regions from the substrate and/or isolates the nanosheet region (or sub-Fin region) from the substrate. Particularly, embodiments of the invention provide silicon-on-insulator (SOI) like isolation on a bulk substrate without requiring additional masks to form anchors in the fabrication process. Further, embodiments of the invention provide full isolation without a requirement for Limited Canyon Space design between the gates (i.e., LimCA is not required). Additionally, a self-aligned dielectric etch stop is provided during the spacer/fin etching operation (e.g., reactive ion etch (RIE)) which will prevent any over-etch into the substrate.

Figure 2B:
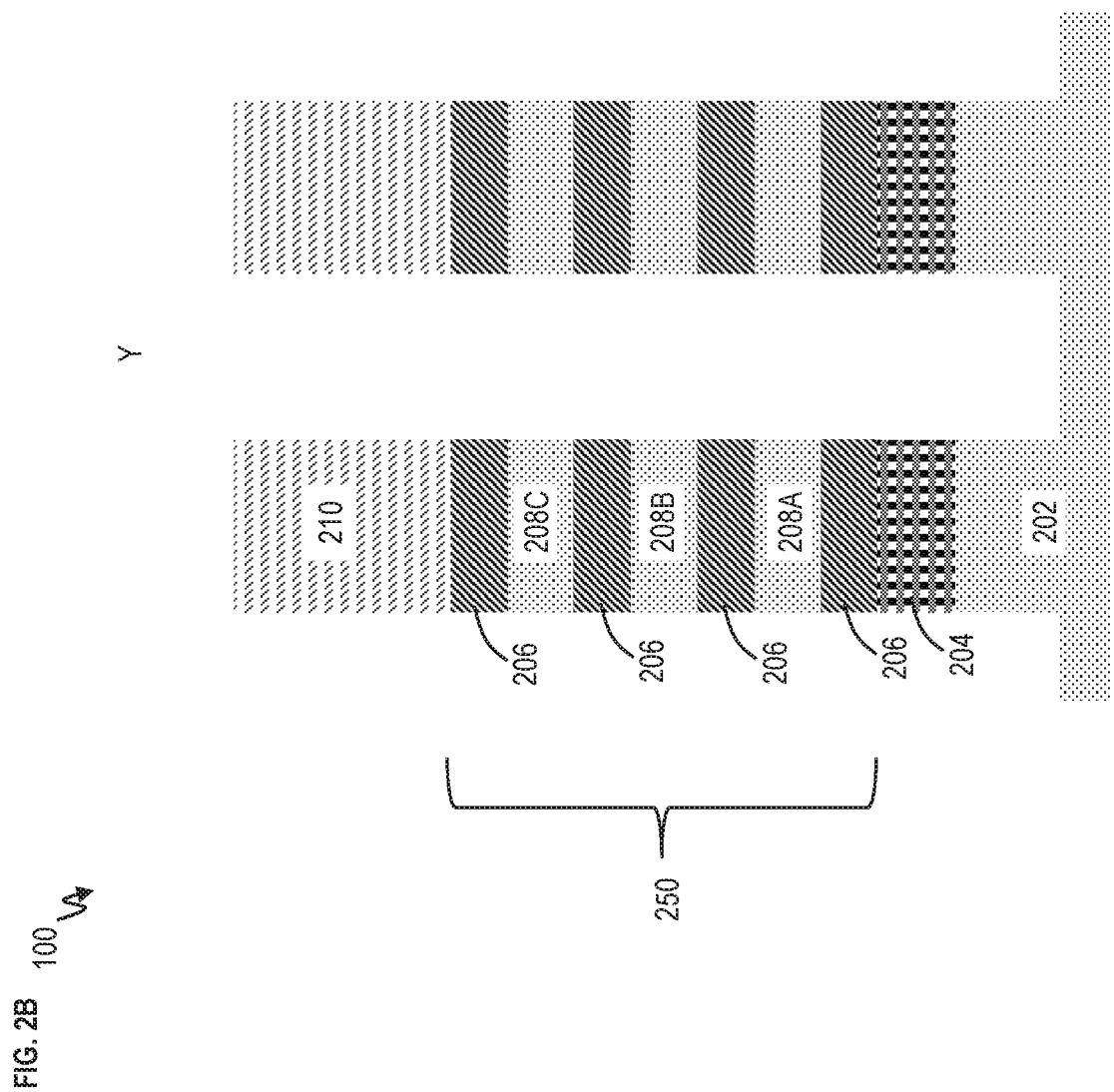
FIG. 2B depicts a cross-sectional view of the semiconductor device taken along line Y in FIG. 1 after an initial set of fabrication operations according to embodiments of the invention.

Turning now to a more detailed description of aspects of the present invention, FIG. 1 depicts a simple diagram of a top view of a semiconductor device 100 according to embodiments of the invention. FIG. 1 is only for reference and illustrates a top-down view locations of the nanosheets and future gates. For simplicity and ease of understanding, FIG. 1 omits some layers (elements) so as to not obscure the figure. FIG. 2A depicts a cross-sectional view of the semiconductor device 100 shown in FIG. 1 taken along line X according to embodiments of the invention. FIG. 2B depicts a cross-sectional view of the semiconductor device 100 shown in FIG. 1 taken along line Y according to embodiments of the invention.

Referring to FIG. 2A, the semiconductor device 100 includes substrate 202. The substrate 202 is formed of semiconductor material. The substrate 202 can be a silicon (Si) substrate, although other materials can be used. After initial fabrication processing, a sacrificial bottom isolation layer 204 is formed on top of the substrate 202 so as to be under an epitaxy nanosheet stack 250 (or fin-like structure). After forming the sacrificial bottom isolation layer 204, the epitaxy nanosheet stack 250 is then formed. The epitaxy nanosheet stack 250 includes sacrificial layers 206 alternatingly formed with channel layer 208A, 208B, and 208C. The channel layer 208A, 208B, and 208C can be generally referred to as channel layers 208. Although three channel layers 208 are shown, more or fewer channel layers 208 can be used, and the number of sacrificial layers 206 will be increased or decreased accordingly. The sacrificial bottom isolation layer 204, sacrificial layers 206, and channel layers 208 can be epitaxially grown.

The sacrificial bottom isolation layer 204 is a material that can be removed (i.e., etched) without etching the layers in the stack 250. That is, the sacrificial bottom isolation layer 204 can be etched/removed without removing the sacrificial layers 206 and the channel layers 208. The sacrificial bottom isolation layer 204 can be silicon germanium (SiGe). To cause the sacrificial bottom isolation layer 204 to be removed/etched without etching the other layers, the sacrificial bottom isolation layer 204 can be SiGe$_{y\ \%}$ where the atomic percent % for "y" ranges from 50-70% atomic percent. Particularly, y in SiGe$_{y\ \%}$ of sacrificial bottom isolation layer 204 can be about (or at least) 60% atomic percent such that the sacrificial bottom isolation layer 204 can be etched/removed without etching layers 206 and 208.

The material of the sacrificial layers 206 can also include SiGe$_{x\ \%}$ where the atomic percent % for "x" ranges from about 15-35% atomic percent (i.e., x is less than y). The material of the channel layers 208 can include Si. The thickness or height H1 of the sacrificial bottom isolation layer 204 can range from about 5 nm to 15 nm, the height H2 of each sacrificial layer 206 can be range from about 5 nm to 15 nm, and the height H3 of each channel layer 208 can range from about 5 nm to 15 nm.

Using semiconductor lithography, fin patterning and formation are performed by forming a fin hardmask 210 on top of the upper sacrificial layer 206. The fin hardmask 210 can be a nitride material, an oxide material, and/or a combination of oxide and nitride materials. Unprotected layers are etched so as to create fin-like structures down through the substrate 202 as can be seen in FIG. 2B.

Figure 3A:
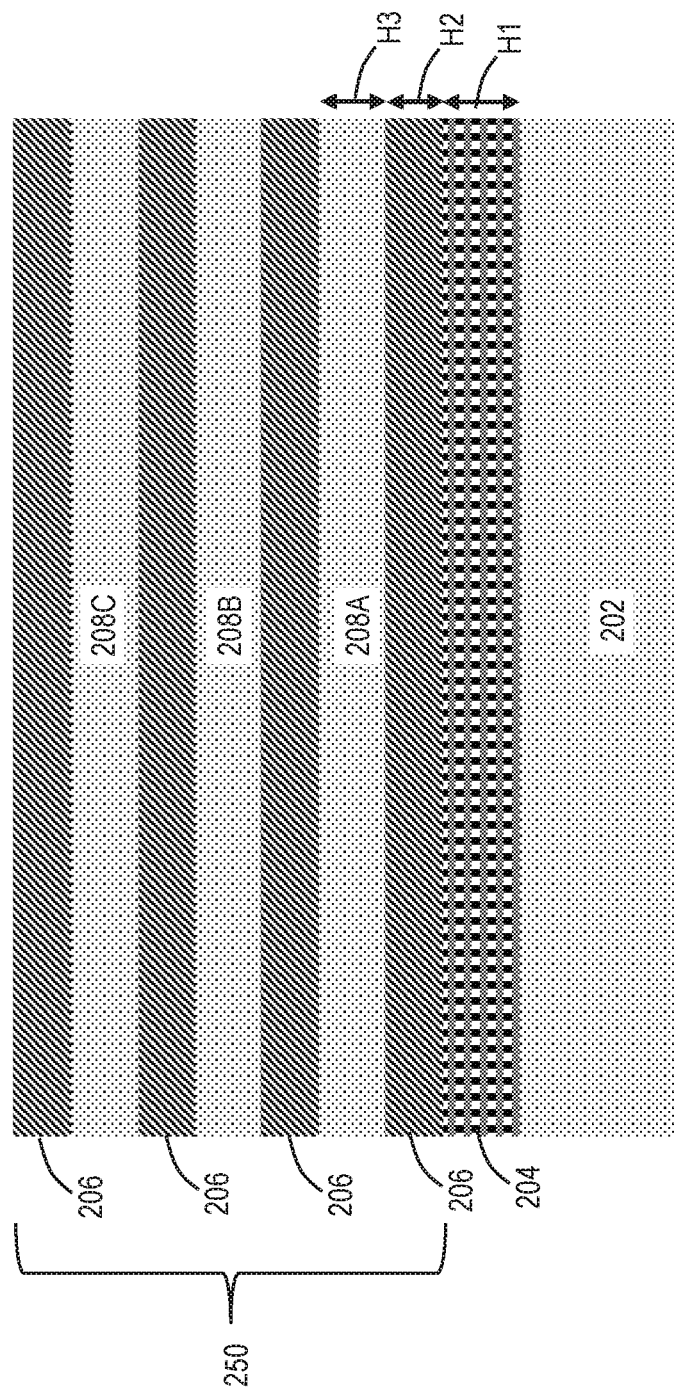
FIG. 3A depicts a cross-sectional view of the semiconductor device taken along line X (shown in FIG. 1) after fabrication operations according to embodiments of the invention.
Figure 3B:
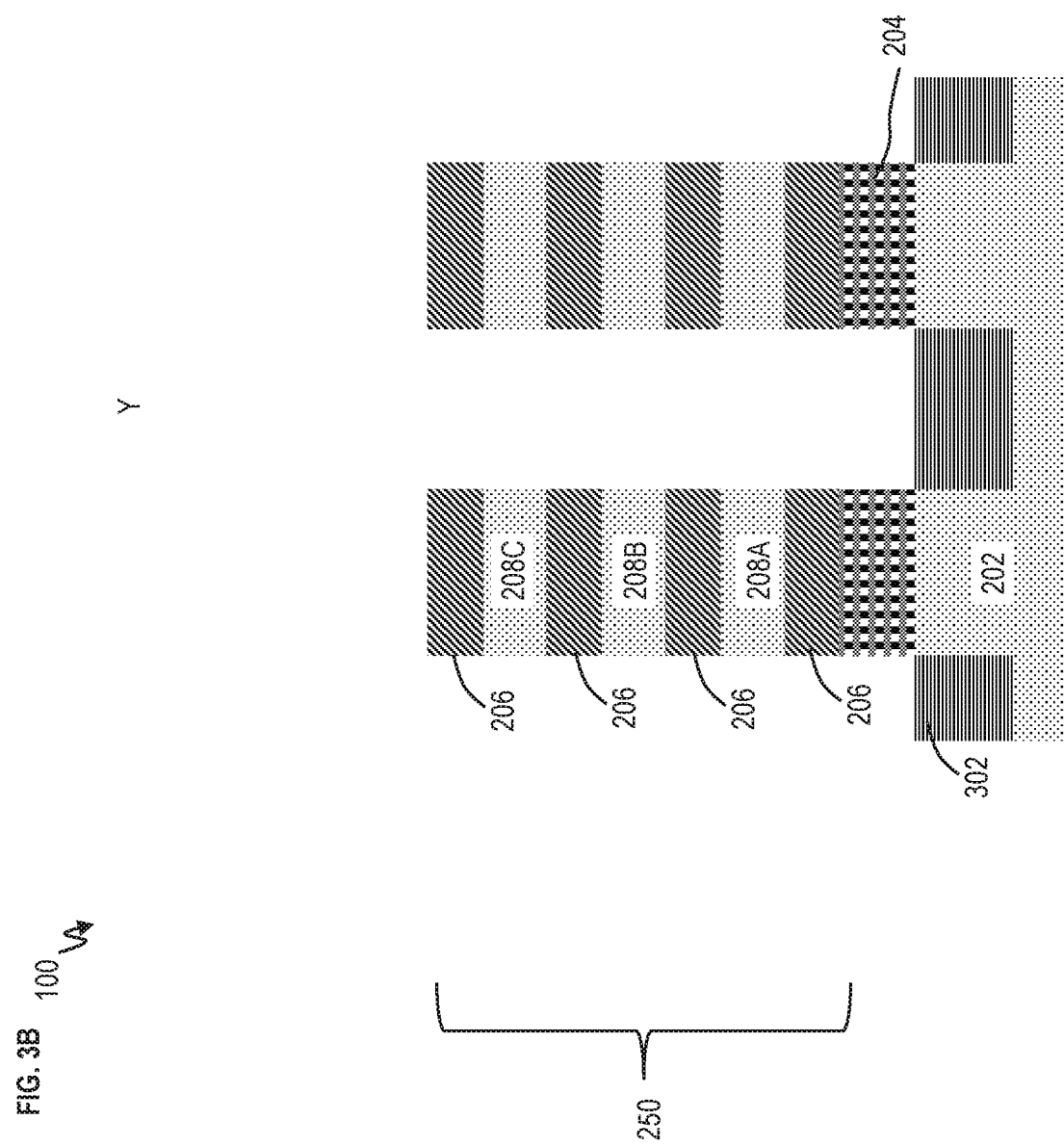
FIG. 3B depicts a cross-sectional view of the semiconductor device taken along line Y (shown in FIG. 1) after fabrication operations according to embodiments of the invention.

FIG. 3A depicts a cross-sectional view of the semiconductor device 100 taken along line X according to embodiments of the invention. FIG. 3B depicts a cross-sectional view of the semiconductor device 100 taken along line Y according to embodiments of the invention. A shallow trench isolation region (STI) 302 is formed in the areas etched during fin formation, as best seen in FIG. 3B. The fin hardmask 210 is removed.

Figure 4B:
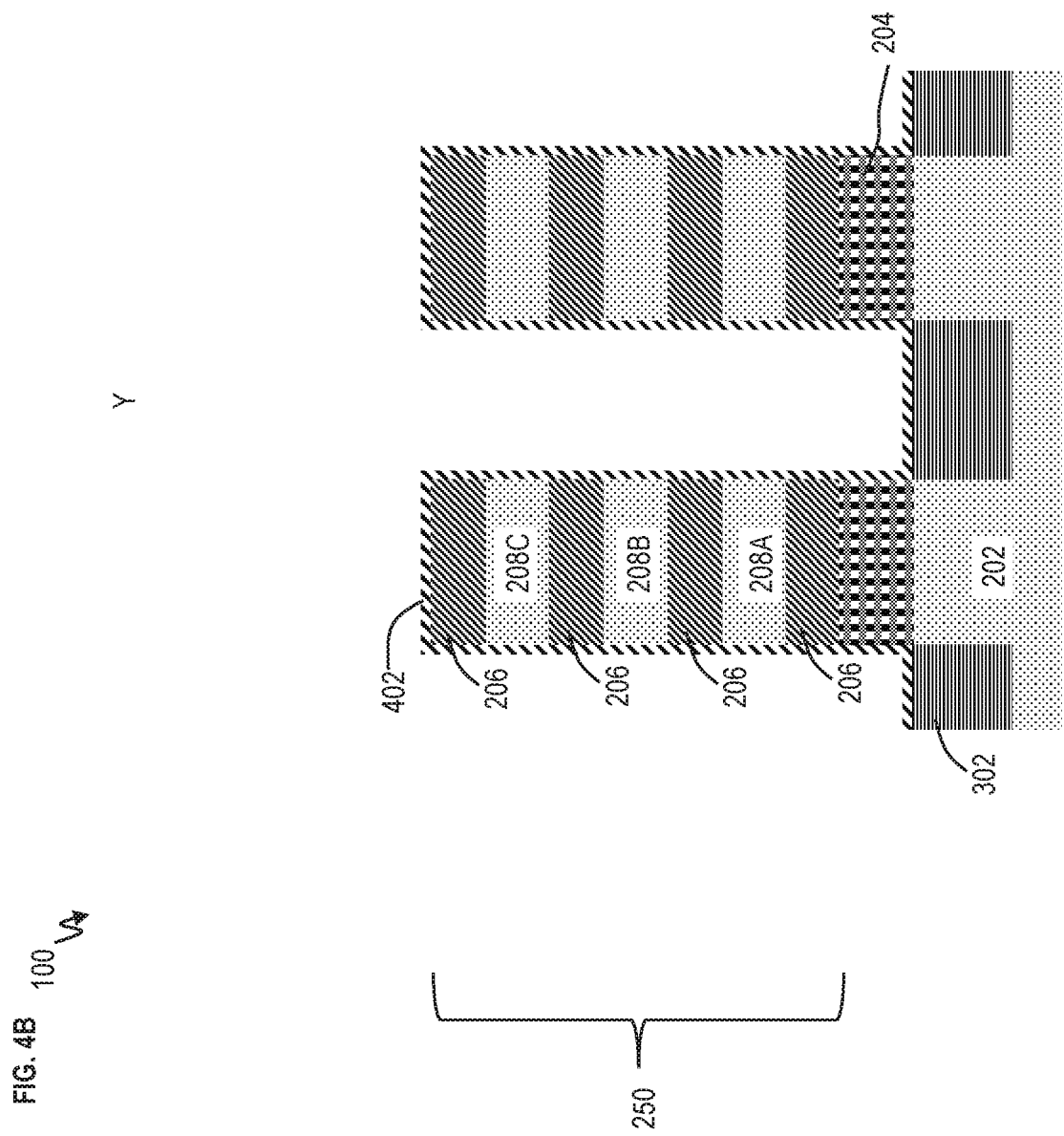
FIG. 4B depicts a cross-sectional view of the semiconductor device taken along line Y (shown in FIG. 1) after fabrication operations according to embodiments of the invention.
Figure 4C:
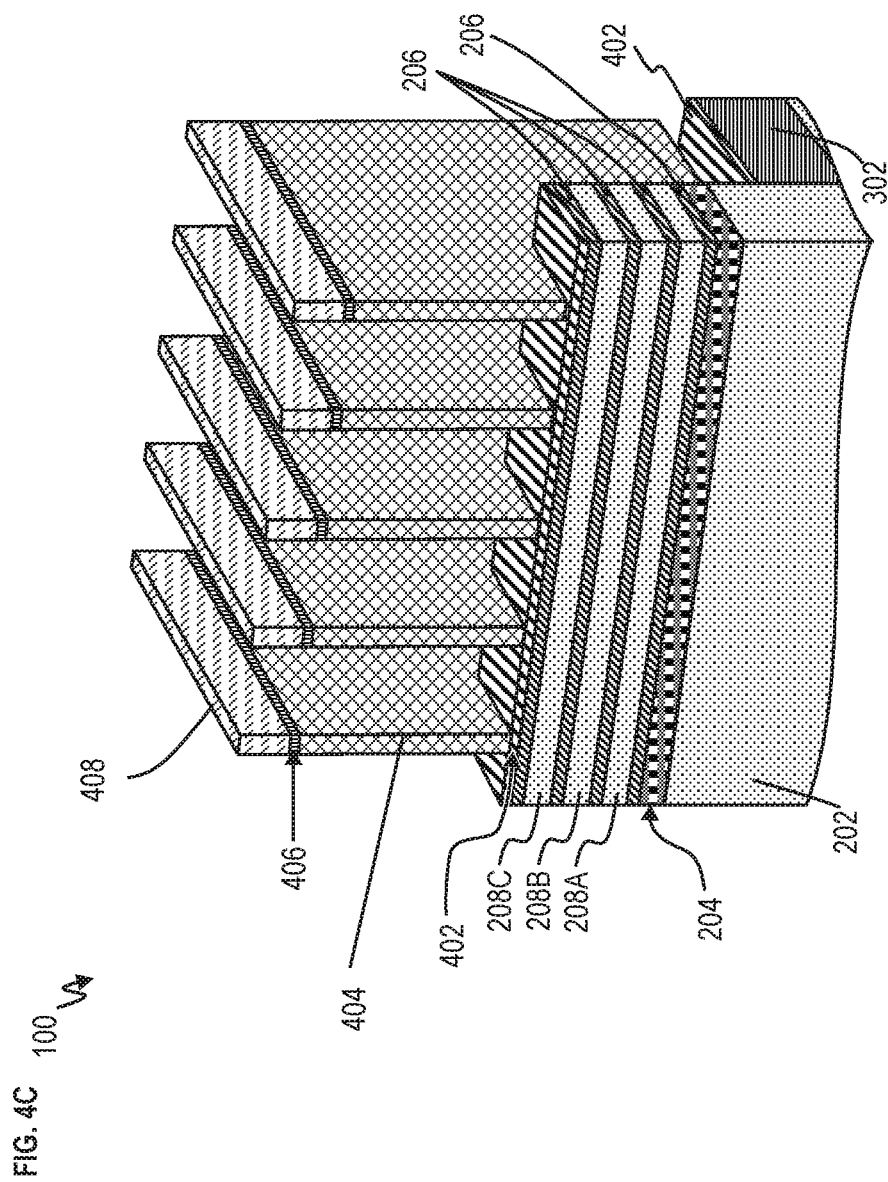
FIG. 4C depicts a three-dimensional view of a portion of the semiconductor after fabrication operations according to embodiments of the invention.

FIG. 4A depicts a cross-sectional view of the semiconductor device 100 taken along line X according to embodiments of the invention. FIG. 4B depicts a cross-sectional view of the semiconductor device 100 taken along line Y according to embodiments of the invention. FIG. 4C depicts a three-dimensional view of a portion of the semiconductor device 100 according to embodiments of the invention. Particularly, FIG. 4C illustrates a cut-away view of a portion the semiconductor device 100.

A dummy dielectric layer 402 is formed on top of the upper sacrificial layer 206. The dummy dielectric layer 402 can be an oxide, such as, SiO$_2$. Dummy gates 404 are formed on top of the dummy dielectric layer 402 as seen in FIG. 4A. The dummy gates 404 can be formed by depositing dummy gate material, such as, amorphous silicon or polycrystalline silicon (poly silicon), on top of the dummy dielectric layer 402. A gate hardmask 408 is formed on the dummy gate material. The gate hardmask 408 can be a nitride, oxide, and/or a combination of nitride and oxide multi-layer. In some implementations, a pad oxide 406 can be deposited on the dummy dielectric layer 402 prior to forming the gate hardmask 408. Gate patterning is formed by patterning the gate hardmask 408 and then using the patterned gate hardmask 408 to etch the dummy gate material into the dummy gates 404.

Figure 5B:
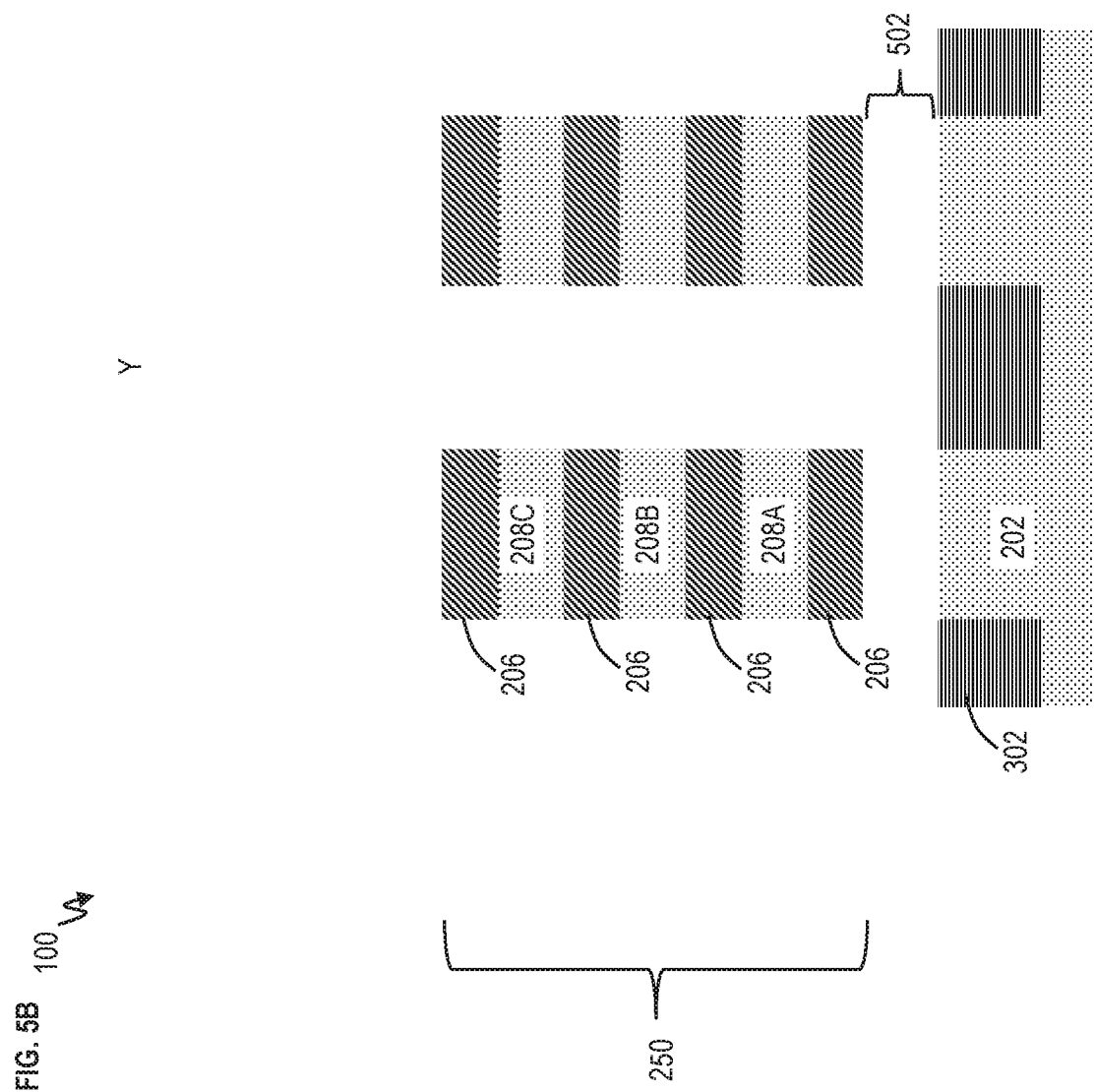
FIG. 5B depicts a cross-sectional view of the semiconductor device taken along line Y (shown in FIG. 1) after fabrication operations according to embodiments of the invention.
Figure 5C:
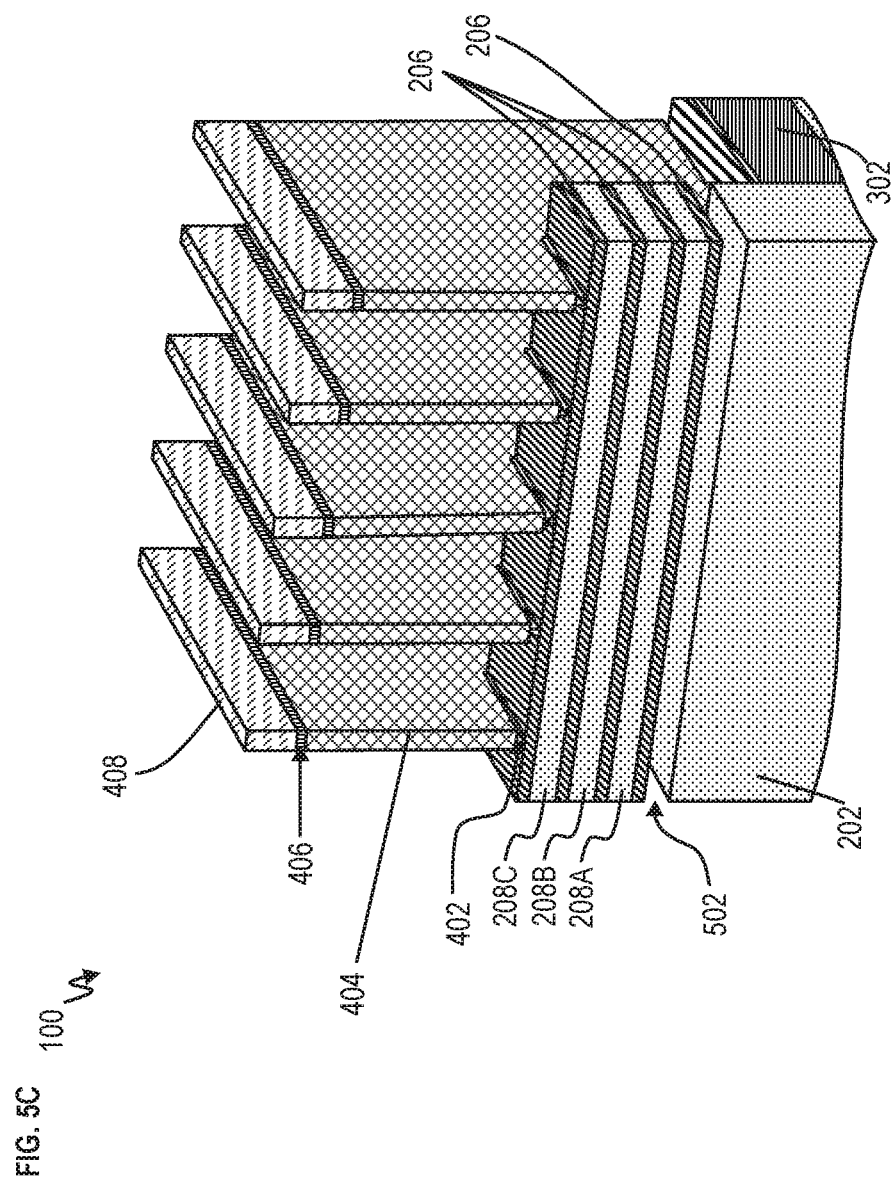
FIG. 5C depicts a three-dimensional view of a portion of the semiconductor after fabrication operations according to embodiments of the invention.

FIG. 5A depicts a cross-sectional view of the semiconductor device 100 taken along line X according to embodiments of the invention. FIG. 5B depicts a cross-sectional view of the semiconductor device 100 taken along line Y according to embodiments of the invention. FIG. 5C depicts a three-dimensional view of a portion of the semiconductor device 100 according to embodiments of the invention. Particularly, FIG. 5C illustrates a cut-away view of a portion the semiconductor device 100.

Portions of the dummy dielectric layer 402 not protected under the gate hardmask 408 are etched, while the protected portions remain. As discussed above, the sacrificial bottom isolation layer 204 is now removed. A selective etch of the sacrificial bottom isolation layer 204 (e.g., $SiGe_{y\,\%}$) is performed which does not remove the other layers, particularly sacrificial layers 206 (e.g., $SiGe_{x\,\%}$). Although both the sacrificial bottom isolation layer 204 and sacrificial layers 206 can be SiGe, the concentration or atomic percent of Ge is more in the sacrificial bottom isolation layer 204 than in the sacrificial layers 206 such that sacrificial bottom isolation layer 204 is etched without etching the sacrificial layers 206. An example etchant can be HCl or $ClF_3$.

Removal of the sacrificial bottom isolation layer 204 creates opening 502 underneath the nanosheet stack 250. Although the layers above the opening 502 appear to be floating, it noted that the layers (including the nanosheet stack 250) are anchored to the dummy gates 404 as depicted in FIG. 5C. The opening 502 is created in preparation for a bottom dielectric isolation layer which is to isolate the source and drain regions as discussed herein.

Figure 6A:
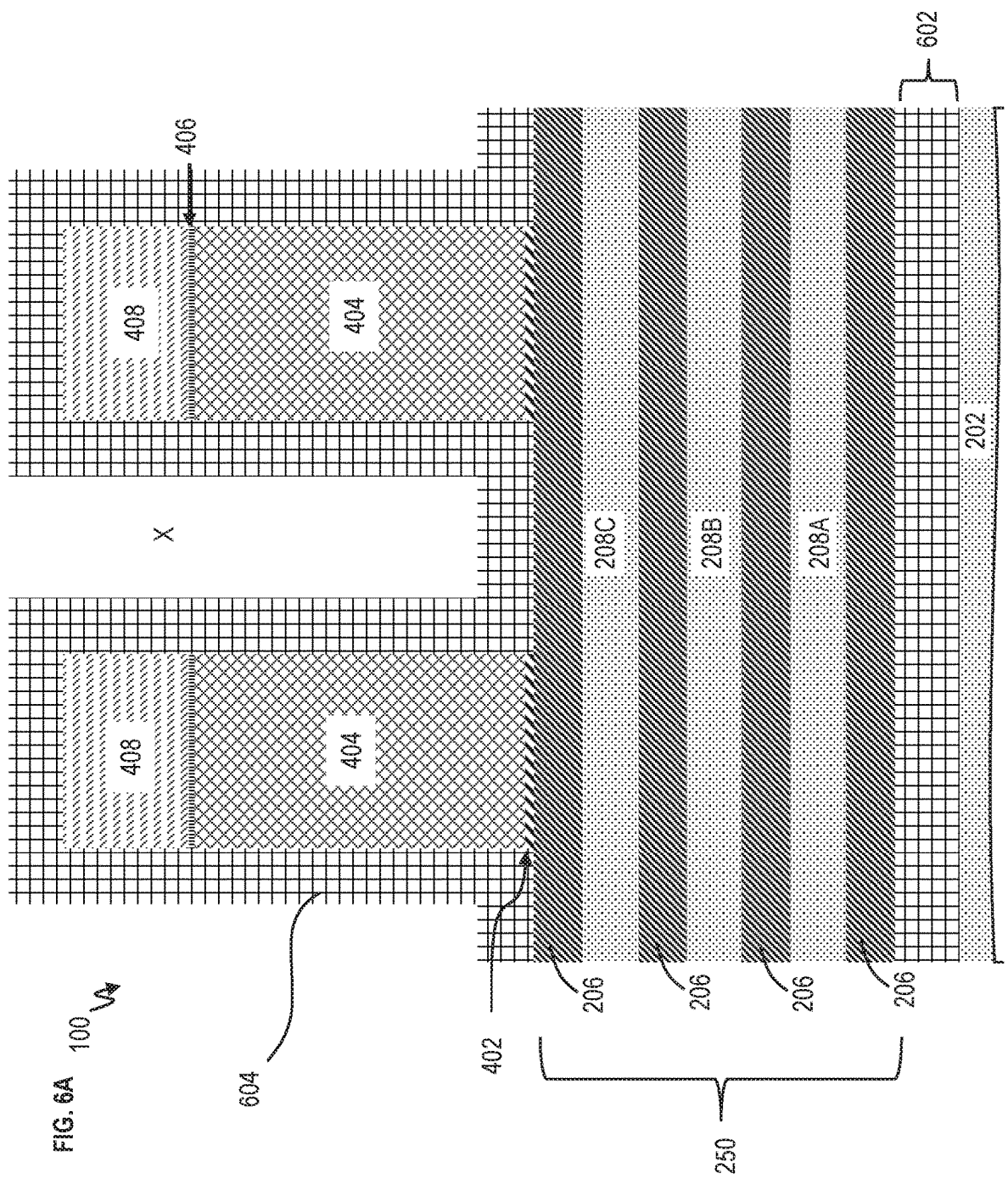
FIG. 6A depicts a cross-sectional view of the semiconductor device taken along line X (shown in FIG. 1) after fabrication operations according to embodiments of the invention.
Figure 6C:
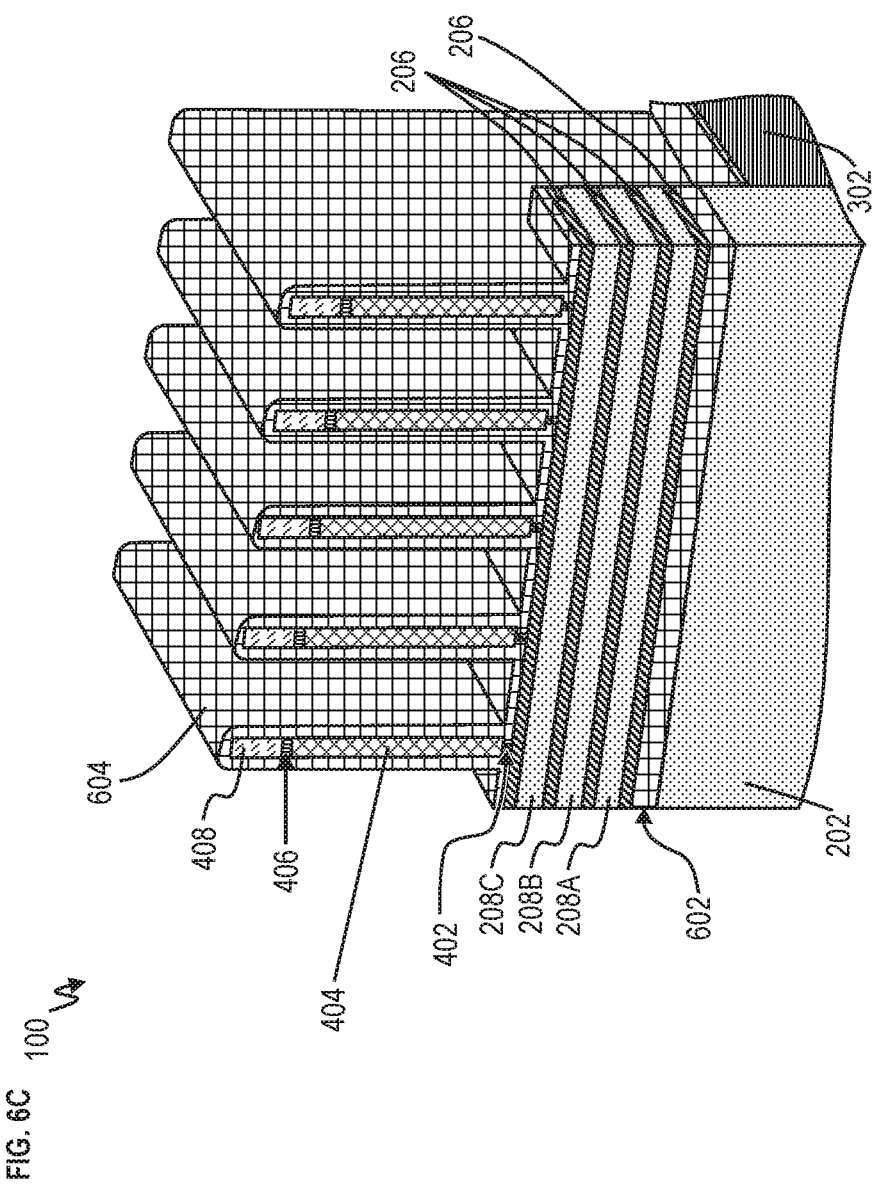
FIG. 6C depicts a three-dimensional view of a portion of the semiconductor after fabrication operations according to embodiments of the invention.

FIG. 6A depicts a cross-sectional view of the semiconductor device 100 taken along line X according to embodiments of the invention. FIG. 6B depicts a cross-sectional view of the semiconductor device 100 taken along line Y according to embodiments of the invention. FIG. 6C depicts a three-dimensional view of a portion of the semiconductor device 100 according to embodiments of the invention. Particularly, FIG. 6C illustrates a cut-away view of a portion the semiconductor device 100.

Conformal deposition of low-k spacer material 604 is performed which simultaneously forms a bottom dielectric isolation layer 602. The bottom dielectric isolation layer 602 is formed in the previous space 502 (shown in FIGS. 5A, 5B, 5C). The low-k spacer material 604 pinches of the space/cavity 502 thereby forming the bottom dielectric isolation layer 602. The bottom dielectric isolation layer 602 is an SOI-like full isolation without requiring an SOI substrate. The low-k spacer material 604 of the bottom dielectric isolation layer 602 can be, for example, silicon boron carbide nitride (SiBCN). Other examples of the low-k spacer material 604 can include SiO, SiOC, SiOCN, etc. The bottom dielectric isolation layer 602 is the same height H1 as the previous sacrificial bottom isolation layer 204 which was removed to create space 502.

FIG. 7A depicts a cross-sectional view of the semiconductor device 100 taken along line X according to embodiments of the invention. FIG. 7B depicts a cross-sectional view of the semiconductor device 100 taken along line Y according to embodiments of the invention. Anisotropic spacer recess is performed using, for example, a directional RIE. This recesses the low-k spacer material 604 on the edges of the dummy gates 404 as shown in FIG. 7A and on the edges of the nanosheet stack 250 as shown in FIG. 7B. Also, a portion of the low-k spacer material 604 is pulled down from the top of the upper sacrificial layer 206 and removed from the STI material/regions 302. The thickness of bottom dielectric isolation layer 602 remains the same.

Figure 8B:
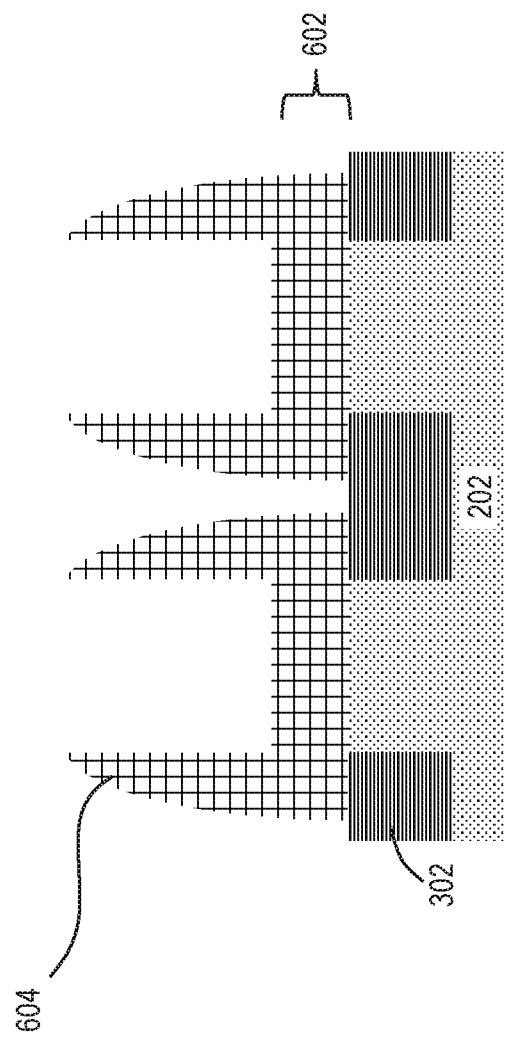
FIG. 8B depicts a cross-sectional view of the semiconductor device taken along line Y (shown in FIG. 1) after fabrication operations according to embodiments of the invention.

FIG. 8A depicts a cross-sectional view of the semiconductor device 100 taken along line X according to embodiments of the invention. FIG. 8B depicts a cross-sectional view of the semiconductor device 100 taken along line Y according to embodiments of the invention. Using the gate hardmask 408 and the low-k spacer material 604, an anisotropic fin recess is performed to recess/trim portions of the nanosheet stack 250 which are not protected. Directional RIE can be used during the fin recess. The bottom dielectric isolation layer 602 provides an etch stop for the fin recess, such that there is no substrate 202 over etch. In other words, the bottom dielectric isolation layer 602 protects the substrate 202 during the fin etch.

FIG. 9A depicts a cross-sectional view of the semiconductor device 100 taken along line X according to embodiments of the invention. FIG. 9B depicts a cross-sectional view of the semiconductor device 100 taken along line Y according to embodiments of the invention. Inner spacers 902 are formed as seen in FIG. 9A. For example, indentation of the sacrificial layers 206 is performed while etching selectively the sacrificial suspension layers 206 to the channel layers 208. As one example sufficient to etch the sacrificial layers 206 while not etching the channel layers 208, the sacrificial layers 206 can be $SiGe_{25\%}$ (e.g., the atomic percent for Ge is 25%) and the channel layers 208 can be Si. Indent cavities (not shown) are created from removing end portions of the sacrificial layers 206. The indent cavities are aligned to the bottom portions of the low-k spacer material 604 on the dummy gates 404. Conformal deposition of a dielectric material (e.g., low-k dielectric material) is performed to pinch off the indent cavities. An isotropic etch back (using a wet or dry process) of the dielectric material is performed to thereby form the inner spacers 902 inside the indent cavities. The low-k dielectric material of the inner spacers 902 can be a nitride based material.

Figure 10B:
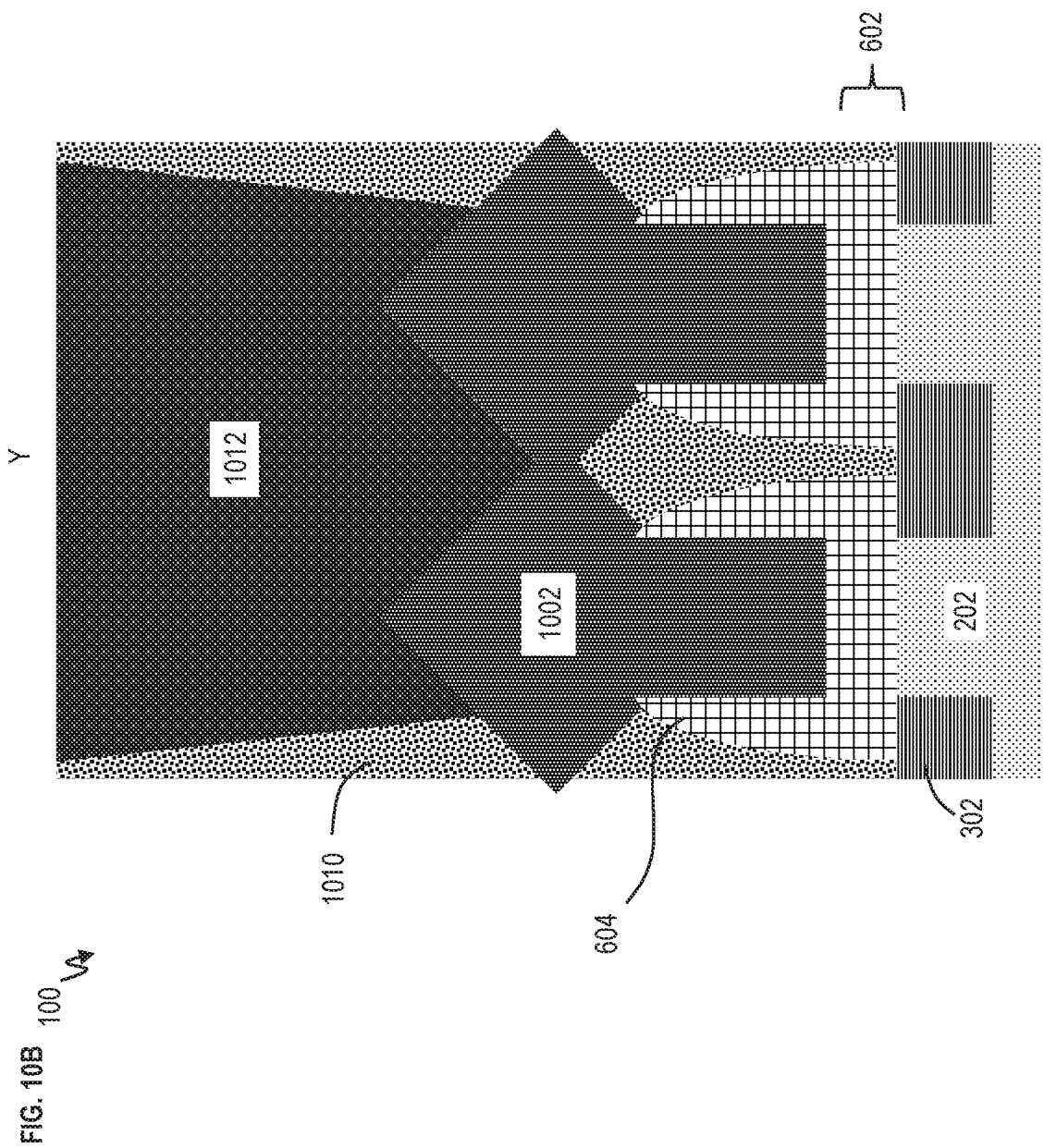
FIG. 10B depicts a cross-sectional view of the semiconductor device taken along line Y (shown in FIG. 1) after fabrication operations according to embodiments of the invention

FIG. 10A depicts a cross-sectional view of the semiconductor device 100 taken along line X according to embodiments of the invention. FIG. 10B depicts a cross-sectional view of the semiconductor device 100 taken along line Y according to embodiments of the invention. Formation of source or drain epitaxy 1002 is performed. The source or drain epitaxy 1002 can be NFET source/drain epitaxial regions or PFET source/drain epitaxial regions according to formation of the NFET or PFET devices. Accordingly, the source or drain epitaxy 1002 can be doped with N-type dopants or P-type dopants as desired. The source or drain epitaxy 1002 can be epitaxially grown from the edges of the channel layers 208.

An inter-level dielectric (ILD) material 1010 is then deposited to cap the source-drain epitaxy 1002. The ILD material 1010 is a low-k dielectric material such as, for example, an oxide material like silicon dioxide. The ILD material 1010 is then recessed by chemical mechanical polishing (CMP) until the gate hardmask layer 408 is reached.

Further, a replacement metal gate (RMG) process is performed. First, the gate hard mask 408 and pad oxide 406 are removed. An etch is then performed to selectively remove the dummy gate 404. The dummy dielectric layer 402 is etched, and finally the sacrificial suspension layers 206 are selectively etched to release the channel layers 208. The selective etch of the sacrificial suspension layers 206 creates openings between the channel layers 208. Conformal high-k metal gate (HKMG) formation is then performed to deposit HKMG layers 1004 which fill the previous locations of the sacrificial layers 206, so as to wrap around the channel layers 208. Optionally, a metal layer 1006 can be formed on the HKMG layers 1004. The metal layer 1006 can include tungsten (W). A self-aligned contact (SAC) cap 1008 is formed on top of the HKMG layers 1004. The SAC cap 1008 is an insulating material, such as, a nitride (e.g., SiN), an oxide (e.g., $SiO_2$), etc.

Trench contact formation is performed in the ILD material 1010 over the source and drain epitaxy 1002, and the source and drain contacts 1012 are formed. The source and drain contacts 1012 can be referred to as trench suicide (TS) contacts. The material of the source and drain contacts 1012 can include one or more layers. The source and drain contacts 1012 can be a Ti/TiN stack in which the titanium (Ti) is deposited first and titanium nitride (TiN) second. Other materials of the source and drain contacts 1012 can be tungsten (W) for instance.

Techniques for forming HKMG in gate openings are well-known in the art and, thus, the details have been omitted in order to allow the reader to focus on the salient aspects of the disclosed methods. However, it should be understood that such HKMG will generally include formation of one or more gate dielectric layers (e.g., an inter-layer (IL) oxide and a high-k gate dielectric layer), which are deposited so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. To avoid clutter in the drawings and to allow the reader to focus on the salient aspects of the disclosed methods, the different layers within the HKMG stack 1004 are not illustrated. For explanation purposes, a high-K gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal alloy.

Figure 11B:
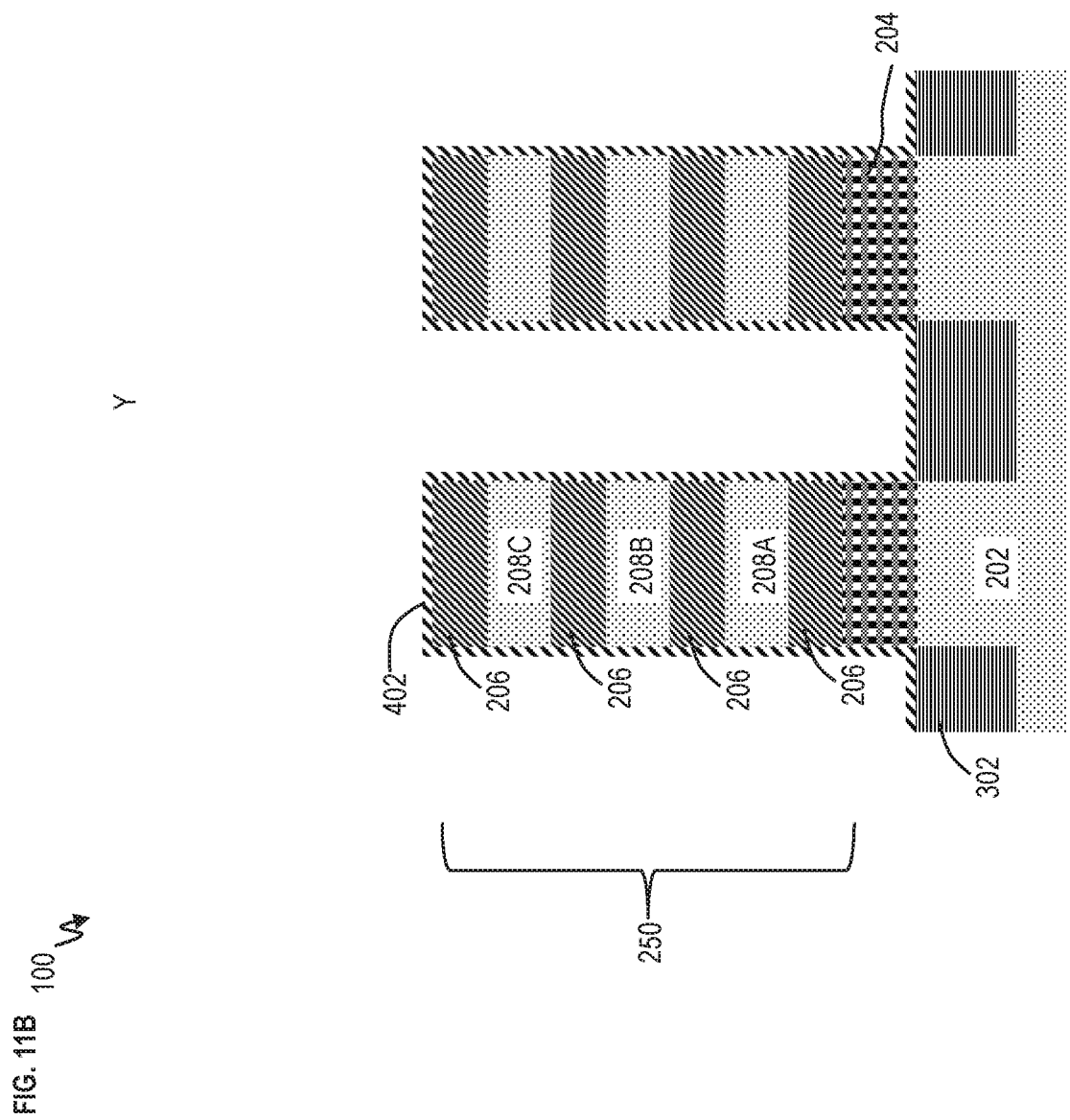
FIG. 11B depicts a cross-sectional view of the semiconductor device taken along line Y (shown in FIG. 1) after fabrication operations according to embodiments of the invention

It should be appreciated that various modifications can be made to the integration method to form a full bottom dielectric isolation of the nanosheet FET and/or FinFET, according to embodiments of the invention. Now turning to further techniques of forming the full bottom dielectric isolation of the nanosheet FET and/or FinFET, FIG. 11A depicts a cross-sectional view of the semiconductor device 100 shown in FIG. 1 taken along line X according to embodiments of the invention. FIG. 11B depicts a cross-sectional view of the semiconductor device 100 shown in FIG. 1 taken along line Y according to embodiments of the invention. FIGS. 11A and 11B start from FIGS. 4A, 4B, and 4C, and accordingly, the description of FIGS. 4A, 4B, and 4C applies to FIGS. 11A and 11B. Further, it should be appreciated that fabrication processes related to FIGS. 1, 2A, 2B, 3A, are 3B have already been performed and discussion of these fabrication processes is not repeated.

As noted with respect to FIGS. 4A, 4B, and 4C, the dummy dielectric layer 402 is formed on top of the upper sacrificial layer 206 in FIGS. 11A and 11B. The dummy dielectric layer 402 can be an oxide, such as, $SiO_2$. Dummy gates 404 are formed on top of the dummy dielectric layer 402 as seen in FIG. 11A. The dummy gates 404 can be formed by depositing dummy gate material, such as, amorphous silicon, on top of the dummy dielectric layer 402. The gate hardmask 408 is formed on the dummy gate material. The gate hardmask 408 can be a nitride, oxide, and/or a combination nitride and oxide multi-layer. In some implementations, a pad oxide 406 can be deposited on the dummy dielectric layer 402 prior to forming the gate hardmask 408. Gate patterning is formed by patterning the gate hardmask 408 and then using the patterned gate hardmask 408 to etch the dummy gate material into the dummy gates 404.

Figure 12B:
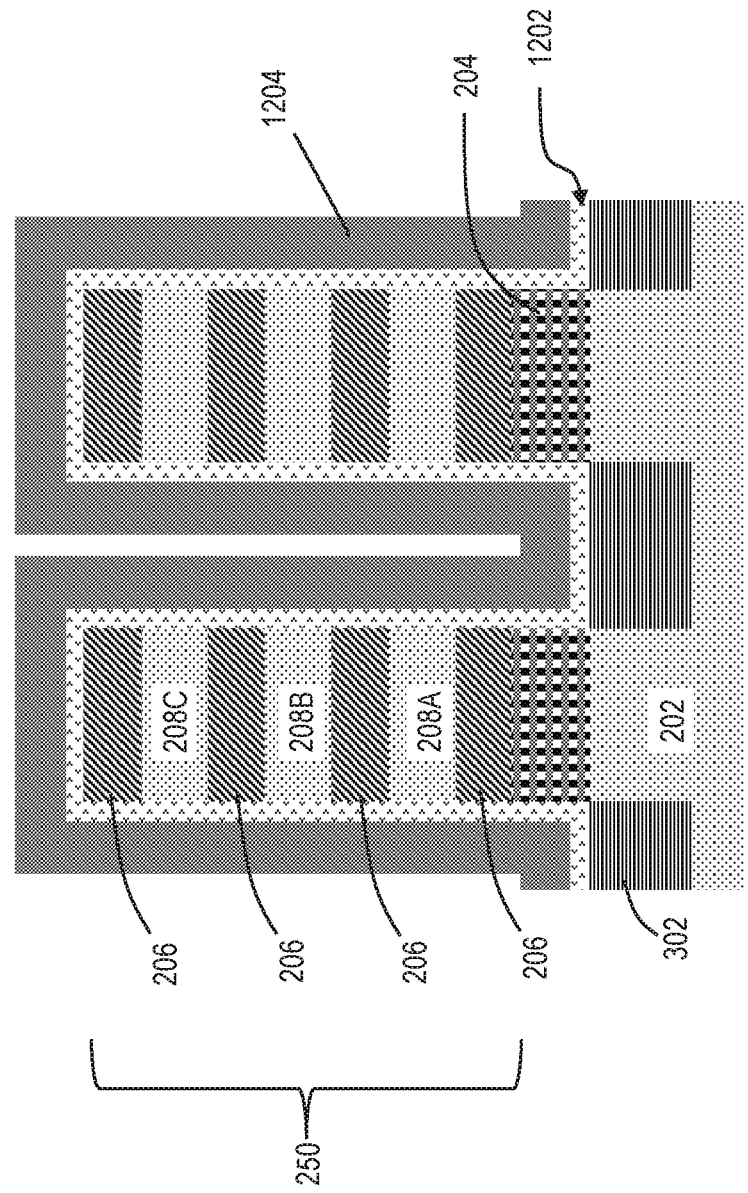
FIG. 12B depicts a cross-sectional view of the semiconductor device taken along line Y (shown in FIG. 1) after fabrication operations according to embodiments of the invention.

FIG. 12A depicts a cross-sectional view of the semiconductor device 100 taken along line X according to embodiments of the invention. FIG. 12B depicts a cross-sectional view of the semiconductor device 100 taken along line Y according to embodiments of the invention. Portions of the dummy dielectric layer 402 not protected under the gate hard mask 408 are etched, while the protected portions remain.

After etching portions of the dummy dielectric layer 402, two spacer layers are formed which were not previously discussed. A first spacer layer 1202 is formed on the sacrificial layers 206, STI regions 302, dummy dielectric layer 402, dummy gates 404, pad oxide 406, and gate hard mask 408. Material of the first spacer layer 1202 can be, for example, an oxide based liner such as $SiO_2$. The first spacer layer 1202 can be formed by conformal deposition. The second spacer layer 1204 is formed on top of the first spacer layer 1202. Material of the second spacer layer 1204 can be, for example, a nitride based material such as SiN showing etch selectivity to the first etch spacer layer 1202.

Figure 13A:
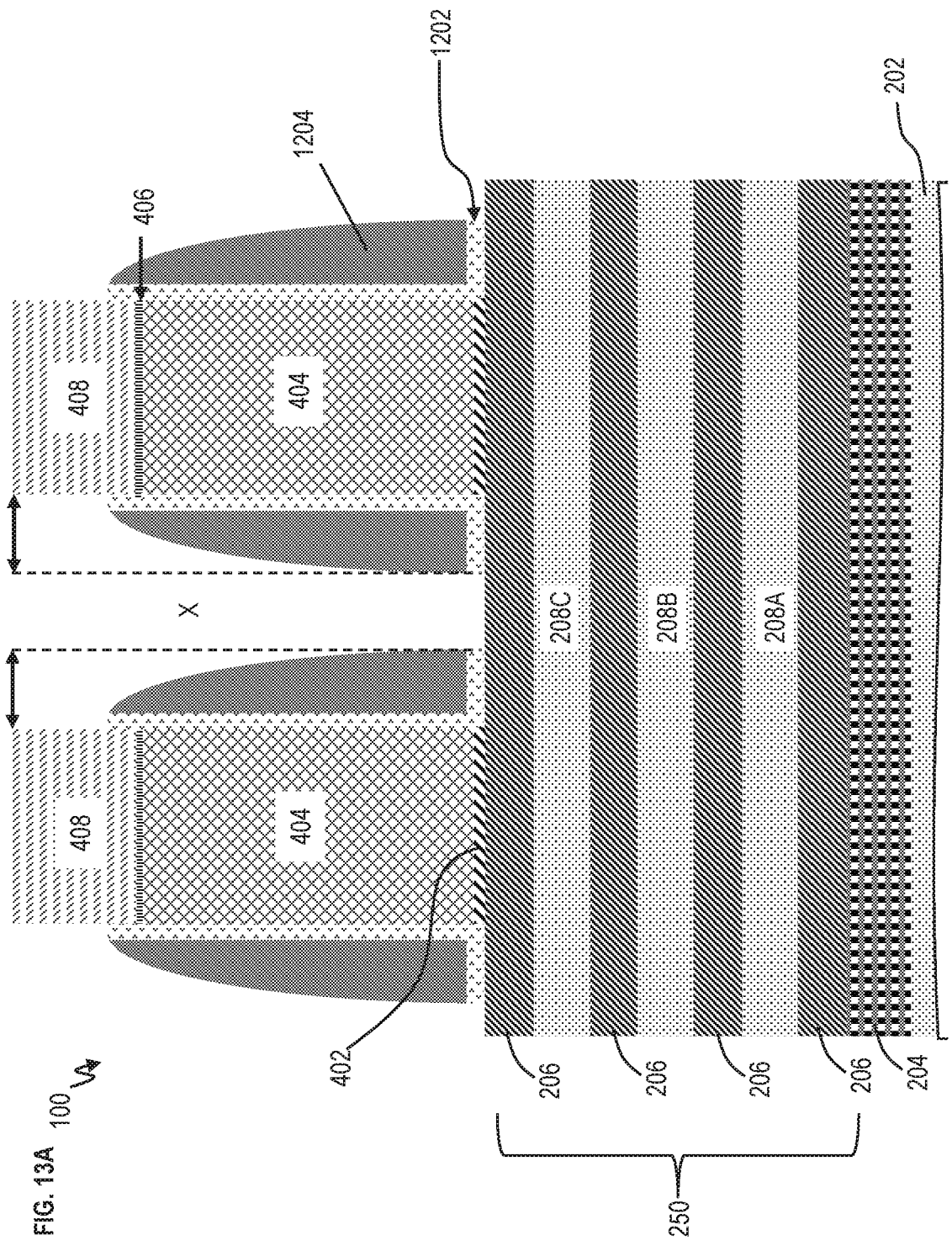
FIG. 13A depicts a cross-sectional view of the semiconductor device taken along line X (shown in FIG. 1) after fabrication operations according to embodiments of the invention.
Figure 13B:
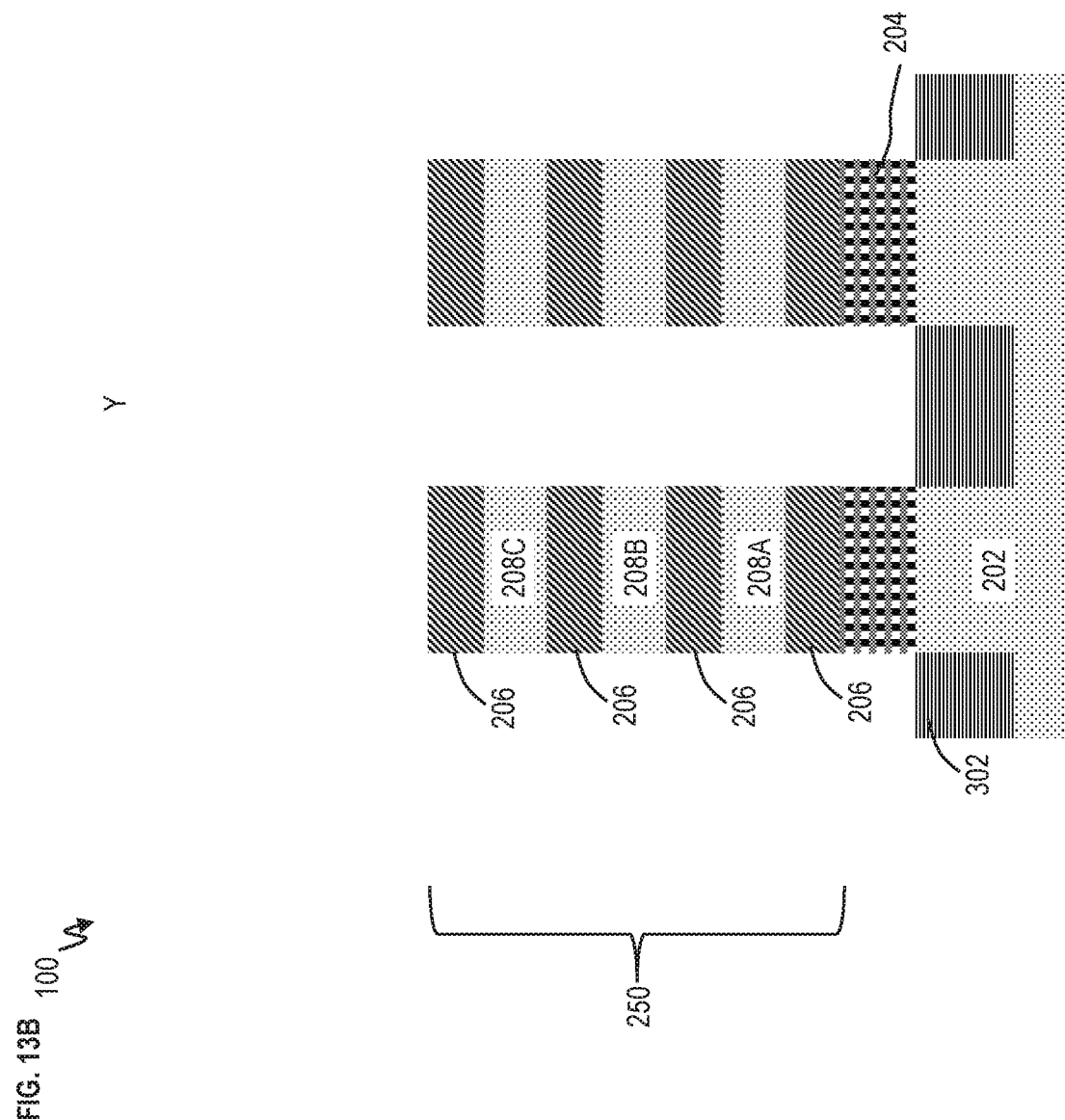
FIG. 13B depicts a cross-sectional view of the semiconductor device taken along line Y (shown in FIG. 1) after fabrication operations according to embodiments of the invention.

FIG. 13A depicts a cross-sectional view of the semiconductor device 100 taken along line X according to embodiments of the invention. FIG. 13B depicts a cross-sectional view of the semiconductor device 100 taken along line Y according to embodiments of the invention. An anisotropic recess of the first spacer layer 1202 (i.e., sacrificial L-shape spacer) and second spacer layer 1204 is performed using a directional etch. The directional etch can be a reactive ion etch. As can be seen in FIG. 13A, the first spacer layer 1202 has an L-shape. FIG. 13B shows that the spacers 1202 and 1204 have been etched completely from the fin and/or nanosheet sidewalls.

The etched or removed portions of first and second spacer layers 1202 and 1204 are designated by dashed lines showing the distance from the gate hard mask 408 to the location of the pre-etched edge of the first and second spacer layers 1202 and 1204. It is noted that the first and second spacer layers 1202 and 1204 can be a single spacer in some embodiments of the invention.

Figure 14A:
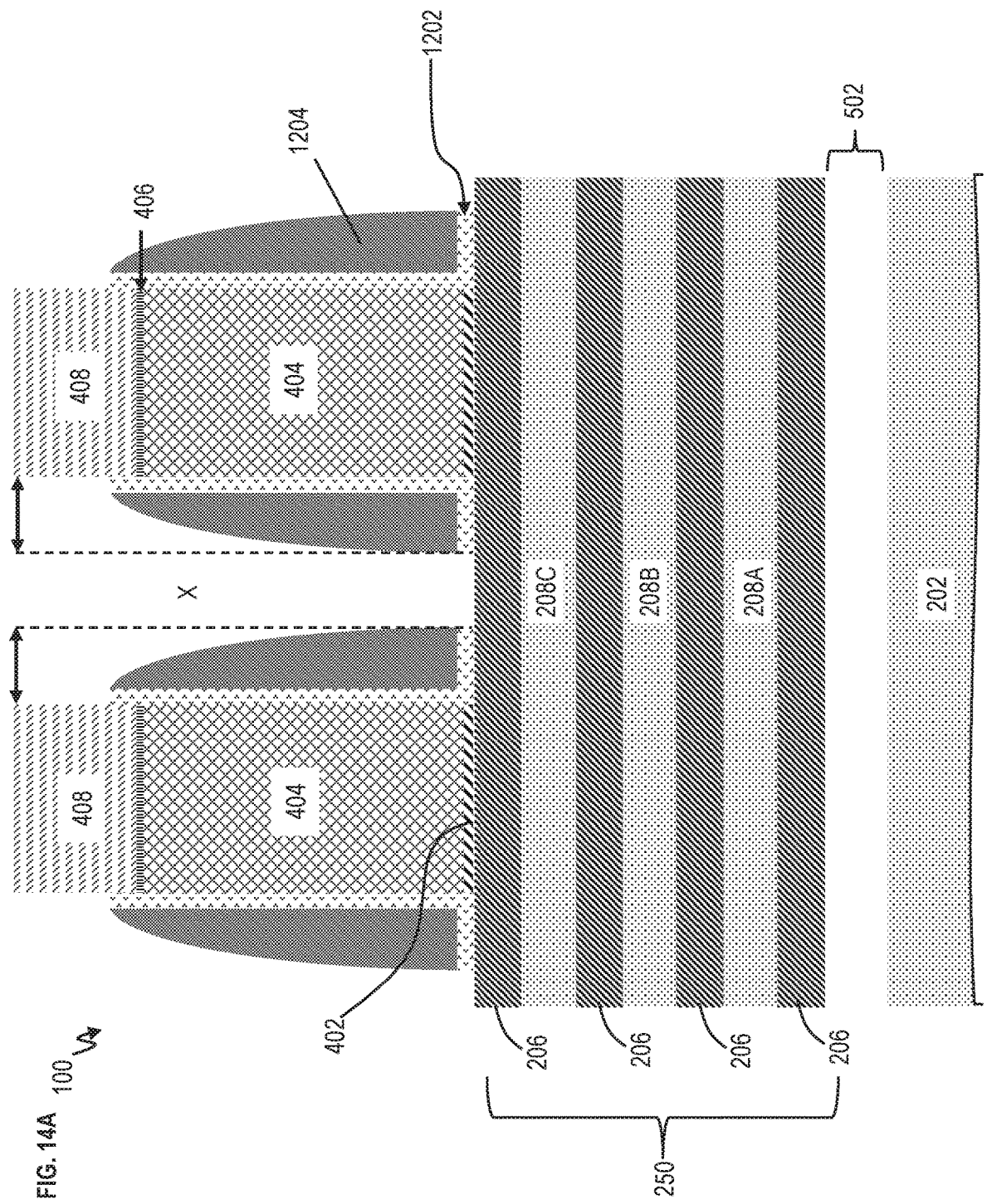
FIG. 14A depicts a cross-sectional view of the semiconductor device taken along line X (shown in FIG. 1) after fabrication operations according to embodiments of the invention.
Figure 14B:
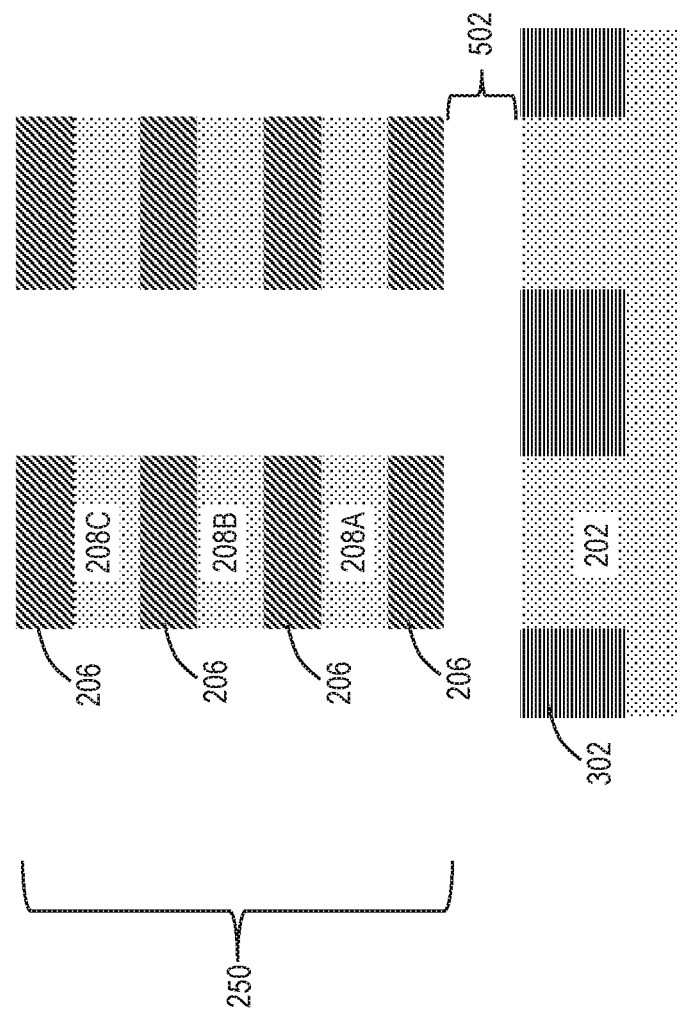
FIG. 14B depicts a cross-sectional view of the semiconductor device taken along line Y (shown in FIG. 1) after fabrication operations according to embodiments of the invention.

FIG. 14A depicts a cross-sectional view of the semiconductor device 100 taken along line X according to embodiments of the invention. FIG. 14B depicts a cross-sectional view of the semiconductor device 100 taken along line Y according to embodiments of the invention. As discussed above with respect to FIGS. 5A, 5B, and 5C, FIGS. 14A and 14B illustrate removal of the sacrificial bottom isolation layer 204. A selective etch of the sacrificial bottom isolation layer 204 (e.g., $SiGe_{y\%}$) is performed which does not remove the other layers, particularly sacrificial layers 206

(e.g., SiGe$_x$ %). Although both the sacrificial bottom isolation layer 204 and sacrificial layers 206 can be SiGe, the concentration or atomic percent of Ge is higher in the sacrificial bottom isolation layer 204 than in the sacrificial layers 206 such that sacrificial bottom isolation layer 204 is etched without etching the sacrificial layers 206. An example etchant can be HCl or ClF$_3$.

Removal of the sacrificial bottom isolation layer 204 creates opening 502 underneath the nanosheet stack as discussed above. It is further noted that the L-shape spacer constituted by layers 1202 and 1204 encapsulates and protects the dummy gates 404 during the selective removal of sacrificial layer 204. This prevents parasitic etching of the dummy gate material, hence preserving the desired Gate Length fixed by the dummy gate patterning. Although the layers above the opening 502 appear to be floating, it is noted that the layers (including the nanosheet stack 250) are anchored to the dummy gates 404 (as previously depicted in FIG. 5C). The opening 502 is created in preparation for a bottom dielectric isolation layer which is to isolate the source and drain regions as discussed herein.

FIG. 15A depicts a cross-sectional view of the semiconductor device 100 taken along line X according to embodiments of the invention. FIG. 15B depicts a cross-sectional view of the semiconductor device 100 taken along line Y according to embodiments of the invention. Selective removal of the first and second spacers 1202 and 1204 is performed. For example, hot phosphorous acid can be used to remove the second spacer layer 1204 (e.g., SiN) and buffered hydrofluoric acid (BHF) can be used to remove the first spacer layer 1202 (e.g., oxide spacer). BHF (also referred to as buffered oxide etch (BOE)) can be a mixture of a buffering agent, such as ammonium fluoride (NH$_4$F), and hydrofluoric acid (HF).

Figure 16B:
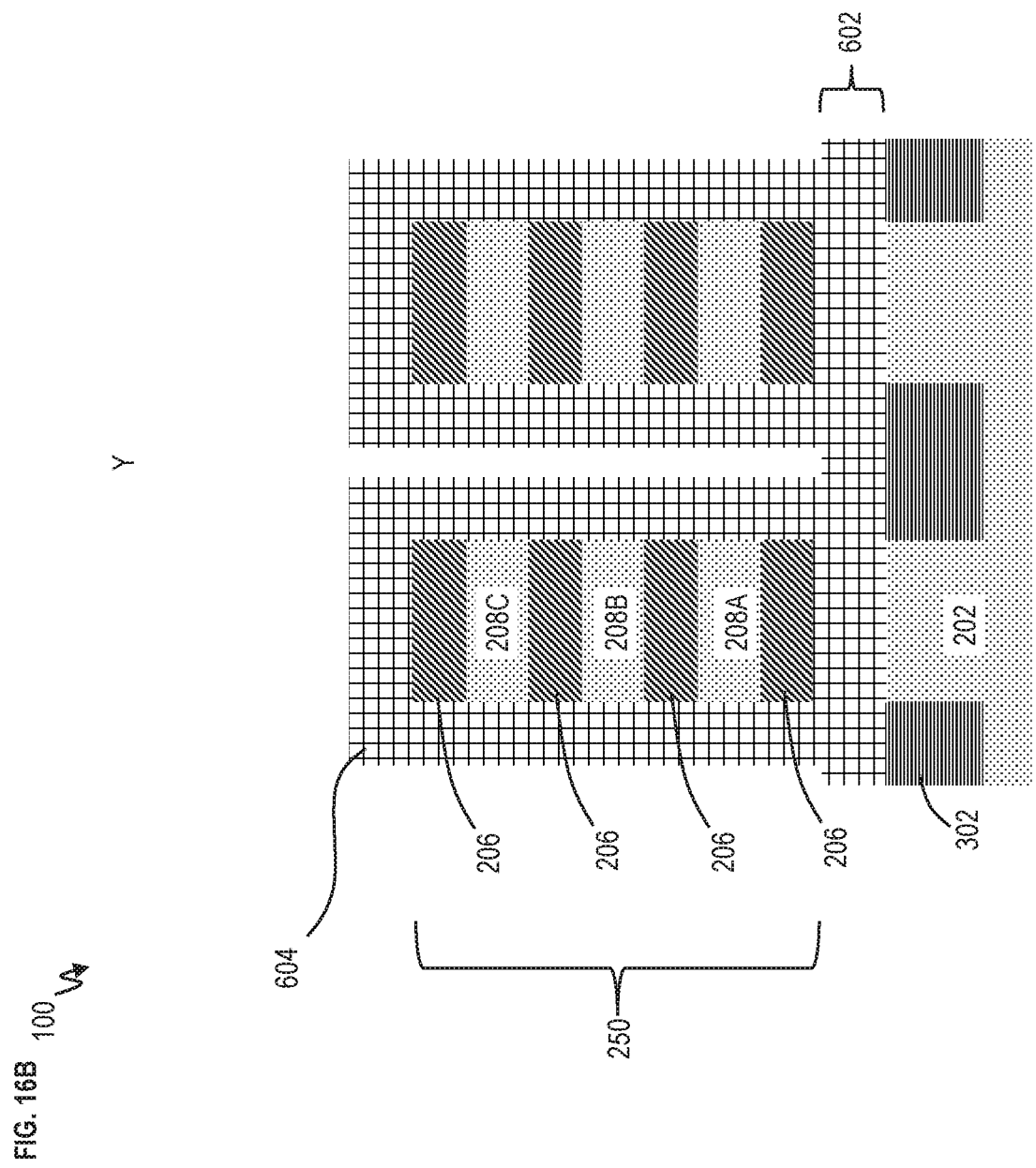
FIG. 16B depicts a cross-sectional view of the semiconductor device taken along line Y (shown in FIG. 1) after fabrication operations according to embodiments of the invention.

FIG. 16A depicts a cross-sectional view of the semiconductor device 100 taken along line X according to embodiments of the invention. FIG. 16B depicts a cross-sectional view of the semiconductor device 100 taken along line Y according to embodiments of the invention. As discussed above in FIGS. 6A, 6B, and 6B, FIGS. 16A and 16B illustrate conformal deposition of low-k spacer material 604 which simultaneously forms the bottom dielectric isolation layer 602. The bottom dielectric isolation layer 602 is formed in the previous space 502. The low-k spacer material 604 pinches of the space/cavity 502 thereby forming the bottom dielectric isolation layer 602. The bottom dielectric isolation layer 602 is an SOI like full isolation. The low-k spacer material 604 of the bottom dielectric isolation layer 602 can be, for example, silicon boron carbide nitride (SiBCN). Other examples of the low-k spacer material 604 can include SiO, SiOC, SiOCN, etc. The bottom dielectric isolation layer 602 is the same height H1 as the previous sacrificial bottom isolation layer 204. Unlike FIGS. 6A, 6B, and 6C discussed above, the low-k spacer material 604 (or low-spacer) has a final spacer thickness small than the total thickness of the first and second spacer 1202 and 1204.

Figure 17A:
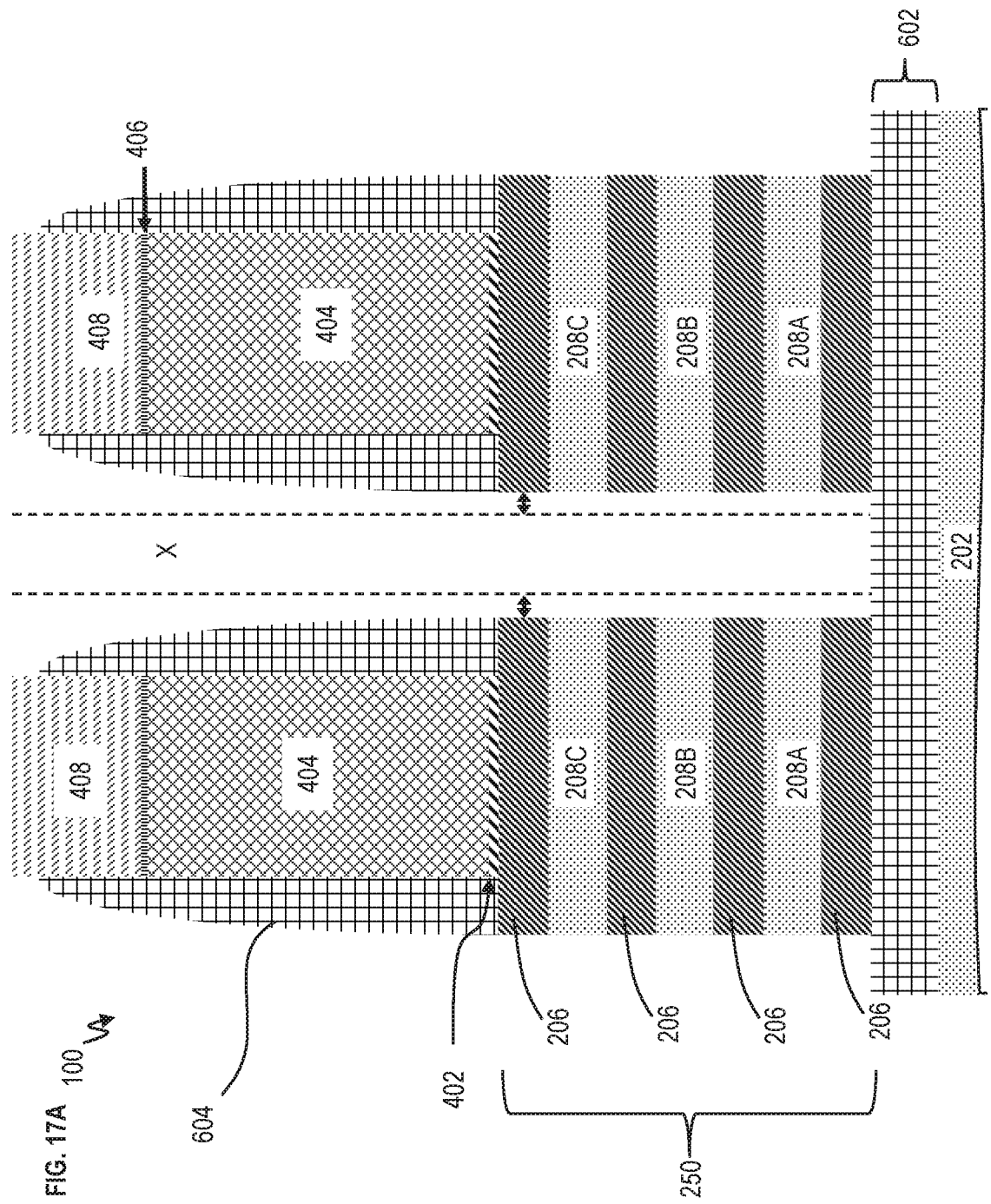
FIG. 17A depicts a cross-sectional view of the semiconductor device taken along line X (shown in FIG. 1) after fabrication operations according to embodiments of the invention.
Figure 17B:
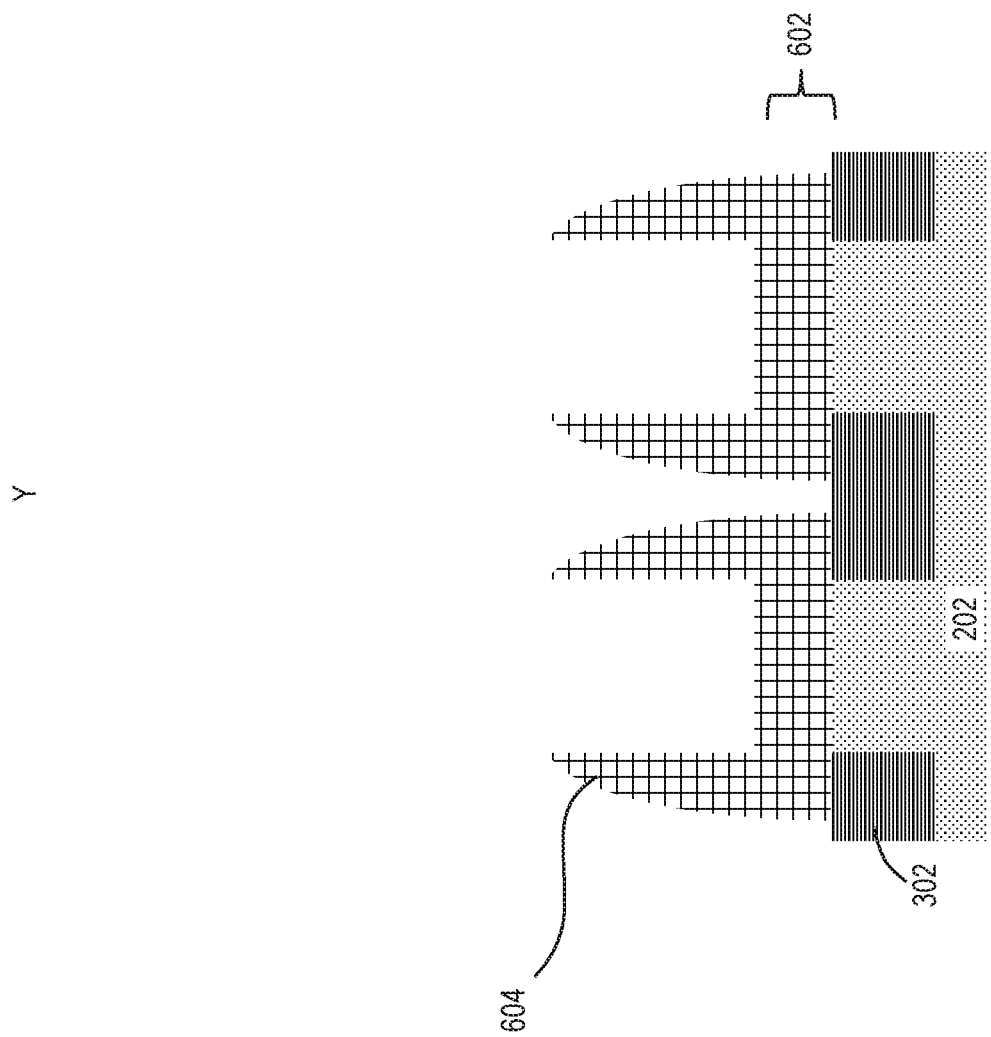
FIG. 17B depicts a cross-sectional view of the semiconductor device taken along line Y (shown in FIG. 1) after fabrication operations according to embodiments of the invention.

FIG. 17A depicts a cross-sectional view of the semiconductor device 100 taken along line X according to embodiments of the invention. FIG. 17B depicts a cross-sectional view of the semiconductor device 100 taken along line Y according to embodiments of the invention. As discussed above in FIGS. 7A and 7B, FIGS. 17A and 17B illustrate that anisotropic spacer recess is performed using, for example, a directional RIE. This recesses the low-k spacer material 604 on the edges of the dummy gates 404 as shown in FIG. 17A and on the edges of the nanosheet stack as shown in FIG. 17B. Also, a portion of the low-k spacer material 604 is pulled down from the top of the upper sacrificial layer 206 and removed from of the STI material/regions 302. Again, etching the low-k spacer material 604 does not reduce the thickness of the bottom dielectric isolation layer 602 as previously mentioned.

Analogous to FIGS. 8A and 8B discussed above, FIGS. 17A and 17B further illustrate using the gate hardmask 408 and the low-k spacer material 604, an anisotropic fin recess is performed to recess/trim portions of the nanosheet stack 250 (shown in FIGS. 2A and 2B) which are not protected. Directional RIE can be used during the fin recess. The bottom dielectric isolation layer 602 serves as an etch stop for the fin recess, such that there is no substrate 202 over etch. In other words, the bottom dielectric isolation layer 602 protects the substrate 202 during the fin etch.

Figure 18B:
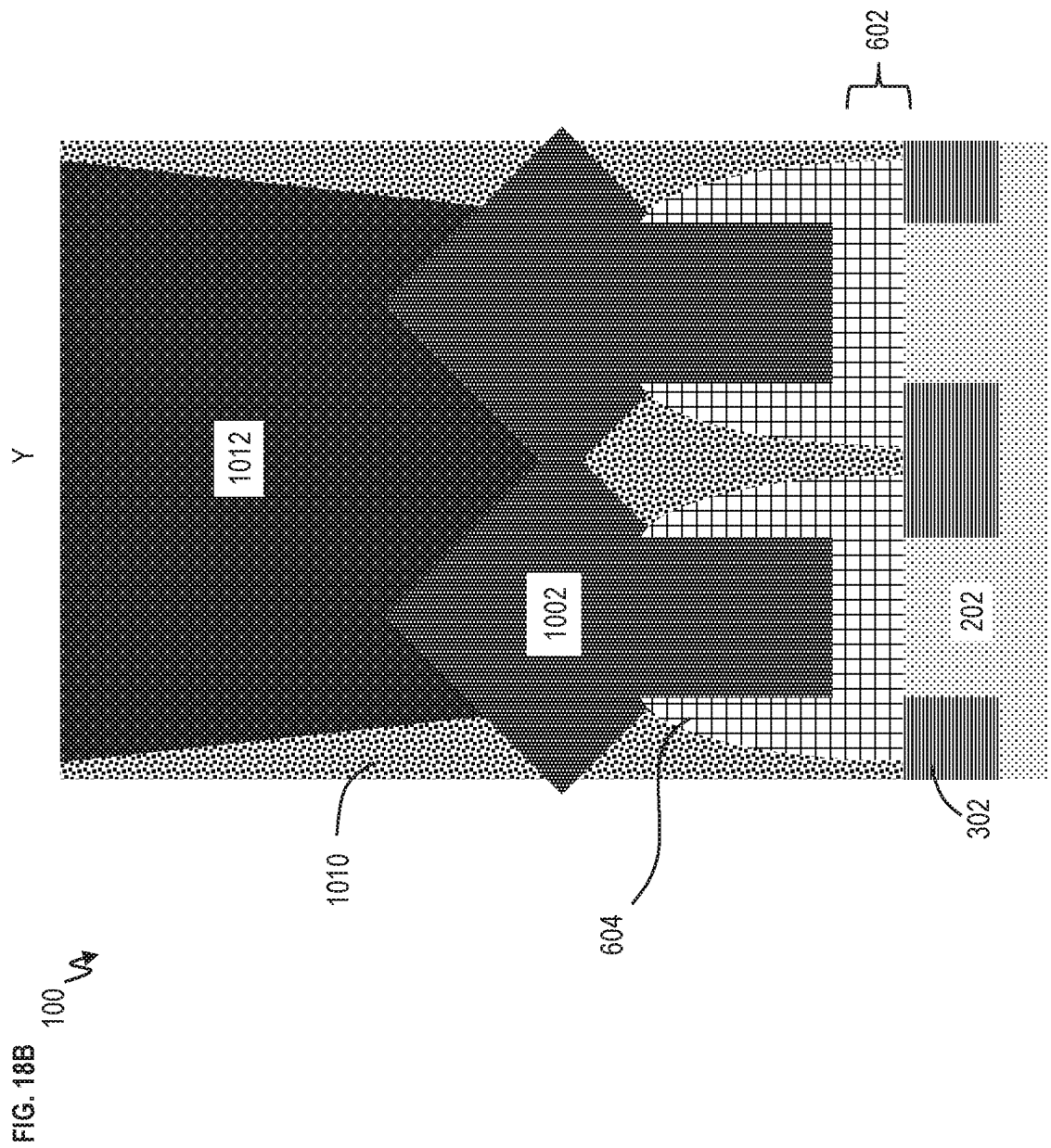
FIG. 18B depicts a cross-sectional view of the semiconductor device taken along line Y (shown in FIG. 1) after fabrication operations according to embodiments of the invention.

FIG. 18A depicts a cross-sectional view of the semiconductor device 100 taken along line X according to embodiments of the invention. FIG. 18B depicts a cross-sectional view of the semiconductor device 100 taken along line Y according to embodiments of the invention. FIGS. 18A and 18B are representative of the fabrication operations discussed in FIGS. 9A, 9B, 10A, and 10B. Some details are not repeated, and further fabrication operations can be found in FIGS. 9A, 9B, 10A, and 10B.

Inner spacers 902 are formed, and indentation of the sacrificial layers 206 is performed while etching selectively the sacrificial suspension layers 206 to the channel layers 208. As one example sufficient to etch the sacrificial layers 206 while not etching the channel layers 208, the sacrificial layers 206 can be SiGe$_{25\%}$ (e.g., the atomic percent for Ge is 25%) and the channel layers 208 can be Si. Indent cavities (not shown) are left from removing end portions of the sacrificial layers 206. The indent cavities are aligned to the bottom portions of the low-k spacer material 604 on the dummy gates 404. Conformal deposition of a dielectric material (e.g., low-k dielectric material) is performed to pinch off the indent cavities. An isotropic etch back (using a wet or dry process) of the dielectric material is performed to thereby form the inner spacers 902 inside the indent cavities. The low-k dielectric material of the inner spacers 902 can be a nitride based material.

Further, formation of source or drain epitaxy 1002 is performed. The source or drain epitaxy 1002 can be NFET source/drain epitaxial regions or PFET source/drain epitaxial regions according to formation of the NFET or PFET devices. Accordingly, the source or drain epitaxy 1002 can be doped with N-type dopants or P-type dopants as desired. The source or drain epitaxy 1002 can be epitaxially grown from the edges of the channel layers 208.

An inter-level dielectric (ILD) material 1010 is then deposited to cap the source-drain epitaxy 1002. The ILD material 1010 is a low-k dielectric material such as, for example, an oxide material like silicon dioxide. The ILD material 1010 is then recessed by chemical mechanical polishing (CMP) until the gate hardmask layer 408 is reached.

Further, a replacement metal gate (RMG) process is performed. First, the gate hard mask 408 and pad oxide 406 are removed. An etch is then performed to selectively remove the dummy gate 404, and the dummy dielectric layer 402 is etched. Finally, the sacrificial suspension layers 206 are selectively etched to release the channel layers 208. The selective etch of the sacrificial suspension layers 206 creates openings between the channel layers 208. Conformal high-k metal gate (HKMG) formation is then performed to deposit HKMG layers 1004 which fill the previous locations of the sacrificial layers 206, so as to wrap around the channel layers 208. Optionally, a metal layer 1006 can be formed on the HKMG layers 1004. The metal layer 1006 can include tungsten (W). A self-aligned contact (SAC) cap 1008 is formed on top of the HKMG layers 1004. The SAC cap 1008 is an insulating material, such as, a nitride (e.g., SiN), an oxide (e.g., $SiO_2$), etc.

Trench contact formation is performed in the ILD material 1010 over the source and drain epitaxy 1002, and the source and drain contacts 1012 are formed. The source and drain contacts 1012 can be referred to as trench suicide (TS) contacts. The material of the source and drain contacts 1012 can include one or more layers. The source and drain contacts 1012 can be a Ti/TiN stack in which the titanium (Ti) is deposited first and titanium nitride (TiN) second. Other materials of the source and drain contacts 1012 can be tungsten (W) for instance.

Techniques for forming HKMG in gate openings are well-known in the art. An earlier example has been provided above for explanation purposes, and reference can be made to the previous example.

According to embodiments of the invention, technical benefits and advantages provide full bottom dielectric isolation of nanosheet FETs and/or FinFETs, provide SOI-like isolation on bulk substrate without requirement of additional masks to form anchors in the fabrication process, and provide full isolation without a requirement for limited canyon space design between the gates. Additional technical benefits provide a self-aligned dielectric etch stop during the spacer/fin RIE operation which will preserve the substrate. Also, no additional masks are required compared to process of record (POR) for nanosheet FETs and FinFETs. Moreover, it should be appreciated that embodiments of the invention provide a great performance booster in the transistor at a minor cost.

Embodiments of the invention utilize the HCl etch (or $ClF_3$ etch) selectivity between high SiGe (>50%) layer and poly Si dummy gate to achieve full remove-and-replace of the high Ge layer to dielectrics. The new dielectric layer (i.e., bottom isolation layer) serves as a control etch stop layer to control the source/drain recess and the space for epitaxy growth in the subsequent processes. The new dielectric layer is also a way to disconnect the current path between the device and the substrate to minimize the DC leakage. This unique method is not limited by the transistor design contacted gate poly-pitch and can be used in any space.

According to embodiments of the invention, a method of forming a semiconductor device 100 is provided. The method includes forming a bottom sacrificial layer 204 on a substrate 202, forming a stack 250 over the bottom sacrificial layer 204 and a dummy gate over the stack 250, removing selectively the bottom sacrificial layer 204 from under the stack 250 so as to leave an opening 502, and forming an isolation layer 602 in the opening 502, the isolation layer 602 being positioned between the stack 250 and the substrate 202.

The method includes forming source and drain regions 1002 over the isolation layer 602. The isolation layer 602 physically and electrically separates the source and drain regions 1002 from the substrate 202. The method includes replacing the dummy gate 404 with a conductive gate structure 1004. The isolation layer 602 separates a bottom portion of the conductive gate structure 1004 from the substrate 202. The stack 250 includes sacrificial layers 206, and material of the bottom sacrificial layer 204 is structured to be selectively etched instead of the sacrificial layers 206 of the stack 250. The material of the bottom sacrificial layer 204 includes a higher atomic percent of an etchable element than the sacrificial layers 206. The bottom sacrificial layer includes a higher atomic percent % of germanium than sacrificial layers 206 in the stack. The isolation layer 602 includes a nitride. The isolation layer 602 includes silicon boron carbide nitride. The source and drain regions 1002 are operable to permit current flow via the channels 208A, 208B, 208C. The isolation layer 602 is positioned to prevent current leakage from one of the source and drain regions 1002 to another one of the source and drain regions 1002 via the substrate 202.

According to embodiments of the invention, a method of forming a semiconductor device 100 is provided. The method including forming a bottom sacrificial layer 204 on a substrate 202, and forming a stack 250 over the bottom sacrificial layer 204, the stack 250 including channel layers 208A, 208B, 208C and sacrificial layers 206. Also, the method including forming a dummy gate 404 over the stack 250, removing the bottom sacrificial layer 204 from under the stack so as to leave an opening 502, forming an isolation layer 602 in the opening 502, the isolation layer being positioned between the stack 250 and the substrate 202. Further the method includes forming source and drain regions 1002 on the isolation layer 602 and replacing the dummy gate 404 and the sacrificial layers 206 with a conductive gate structure 1004.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a bottom sacrificial layer on a substrate;
   forming a stack over the bottom sacrificial layer and a dummy gate over the stack, inner spacers being positioned on sides of the dummy gate;
   removing the bottom sacrificial layer from under the stack so as to leave an opening; and
   forming an isolation layer in the opening, the isolation layer being positioned between the stack and the substrate, one or more of the inner spacers being in direct contact with a top surface of the isolation layer.

2. The method of claim 1 further comprising forming source and drain regions over the isolation layer.

3. The method of claim 2, wherein the isolation layer physically and electrically separates the source and drain regions from the substrate.

4. The method of claim 2 further comprising replacing the dummy gate with a conductive gate structure.

5. The method of claim 4, wherein the isolation layer separates a bottom portion of the conductive gate structure from the substrate.

6. The method of claim 1, wherein:
   the stack comprises sacrificial layers; and
   material of the bottom sacrificial layer is structured to be selectively etched instead of the sacrificial layers of the stack.

7. The method of claim 6, wherein the material of the bottom sacrificial layer comprises a higher atomic percent of an etch enhancing element than the sacrificial layers.

8. The method of claim 1, wherein the bottom sacrificial layer comprises a higher atomic percent of germanium than sacrificial layers in the stack.

9. The method of claim 1, wherein the isolation layer comprises a nitride.

10. The method of claim 1, wherein the isolation layer comprises silicon boron carbide nitride.

11. The method of claim 1, wherein source and drain regions are formed on the isolation layer and are operable to permit current flow via channels in the stack.

12. The method of claim 11, wherein the isolation layer is positioned to prevent current leakage from one of the source and drain regions to another one of the source and drain regions via the substrate.

13. A method of forming a semiconductor device, the method comprising:
   forming a bottom sacrificial layer on a substrate;
   forming a stack over the bottom sacrificial layer, the stack comprising channel layers and sacrificial layers;
   forming a dummy gate over the stack;
   removing the bottom sacrificial layer from under the stack so as to leave an opening;
   forming an isolation layer in the opening, the isolation layer being positioned between the stack and the substrate;
   forming source and drain regions on the isolation layer; and
   replacing the dummy gate and the sacrificial layers with a conductive gate structure, inner spacers being positioned on sides of the conductive gate structure, one or more of the inner spacers being in direct contact with a top surface of the isolation layer.

* * * * *